US011398443B2

(12) United States Patent
Oh et al.

(10) Patent No.: US 11,398,443 B2
(45) Date of Patent: Jul. 26, 2022

(54) MEMORY DEVICE HAVING LOGIC CIRCUIT DISTRIBUTED ACROSS TWO PERIPHERAL WAFER

(71) Applicant: SK hynix Inc., Icheon-si (KR)

(72) Inventors: Sung Lae Oh, Icheon-si (KR); Sang Woo Park, Icheon-si (KR); Dong Hyuk Chae, Icheon-si (KR); Ki Soo Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/210,698

(22) Filed: Mar. 24, 2021

(65) Prior Publication Data

US 2022/0122932 A1 Apr. 21, 2022

(30) Foreign Application Priority Data

Oct. 21, 2020 (KR) .................. 10-2020-0137044

(51) Int. Cl.
| | |
|---|---|
| *H01L 25/065* | (2006.01) |
| *H01L 23/00* | (2006.01) |
| *H01L 25/18* | (2006.01) |
| *G11C 16/08* | (2006.01) |
| *G11C 7/10* | (2006.01) |

(52) U.S. Cl.
CPC ............ H01L 24/08 (2013.01); G11C 7/10 (2013.01); G11C 16/08 (2013.01); H01L 25/0657 (2013.01); H01L 25/18 (2013.01); *H01L 2224/08145* (2013.01); *H01L 2924/1431* (2013.01); *H01L 2924/14511* (2013.01)

(58) Field of Classification Search
CPC ..... H01L 24/08; H01L 25/0657; H01L 25/18; H01L 2224/08145; H01L 2924/1431; H01L 2924/14511; G11C 7/10; G11C 16/08
See application file for complete search history.

(56) References Cited

U.S. PATENT DOCUMENTS

| | | | |
|---|---|---|---|
| 2021/0013088 A1* | 1/2021 | Chen | ........................ H01L 24/32 |
| 2021/0118988 A1* | 4/2021 | Gan | ......................... H01L 24/08 |
| 2021/0118989 A1* | 4/2021 | Liu | ...................... H01L 23/5283 |
| 2022/0077088 A1* | 3/2022 | Okada | ..................... H01L 24/08 |

FOREIGN PATENT DOCUMENTS

| | | |
|---|---|---|
| KR | 1020210110995 A | 9/2021 |
| KR | 10-2021-0152147 A | 12/2021 |

\* cited by examiner

*Primary Examiner* — Thanh Y. Tran

(57) ABSTRACT

A memory device having a vertical structure includes a memory cell array defined in a cell wafer, and having a plurality of word lines extending in a first direction and arranged in a second direction, and having a plurality of bit lines extending in the second direction and arranged in the first direction; and a logic circuit configured to control the memory cell array, and including a page buffer low-voltage circuit, a page buffer high-voltage circuit, a row decoder circuit and a peripheral circuit, wherein the page buffer low-voltage circuit is disposed in a first peripheral wafer and the page buffer high-voltage circuit, the row decoder circuit and the peripheral circuit are disposed in a second peripheral wafer, and wherein the cell wafer overlaps with the first peripheral wafer and the second peripheral wafer in a vertical direction that is perpendicular to a plane formed by the first direction and the second direction.

20 Claims, 19 Drawing Sheets

FIG.4
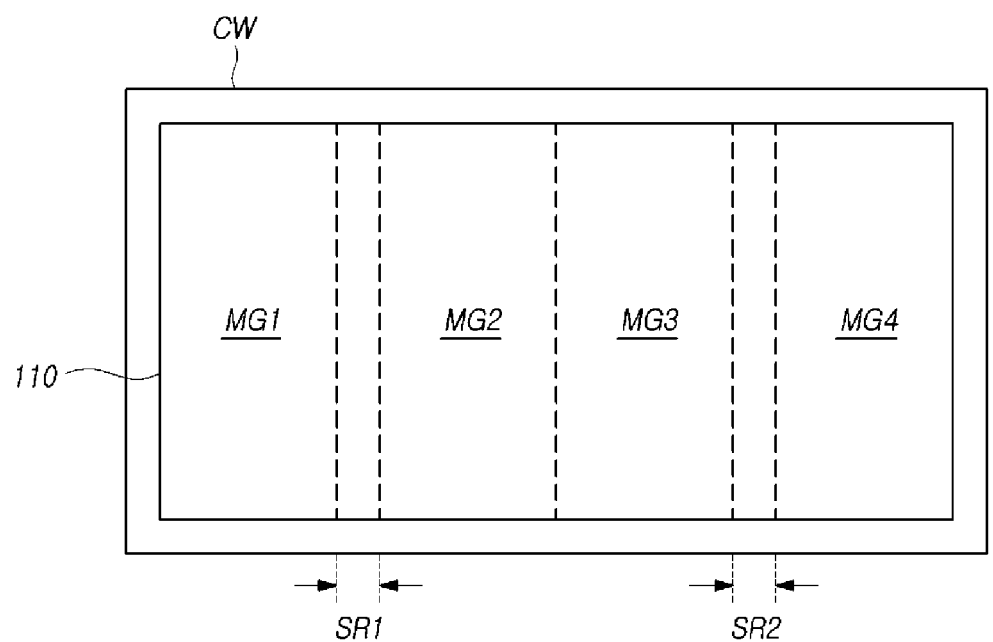
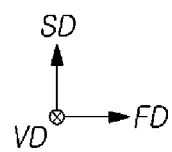

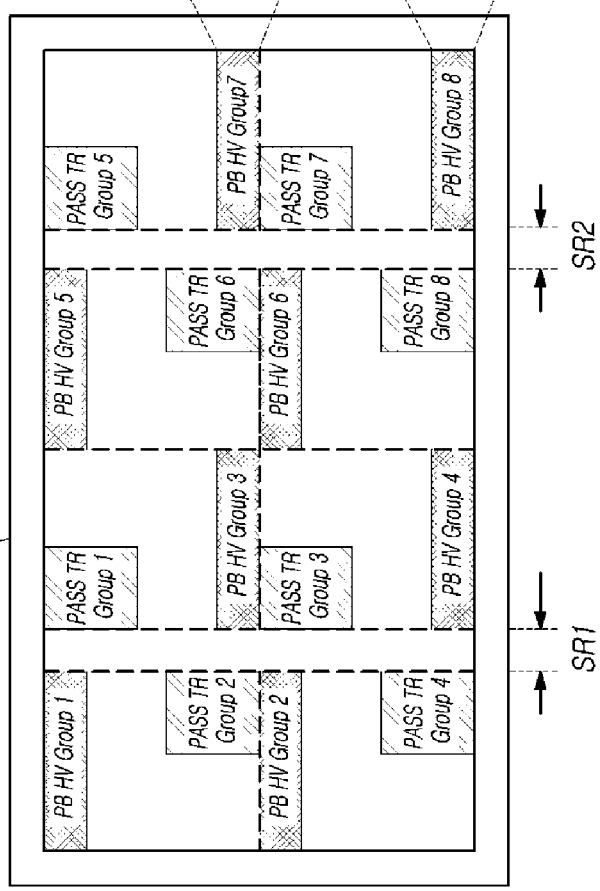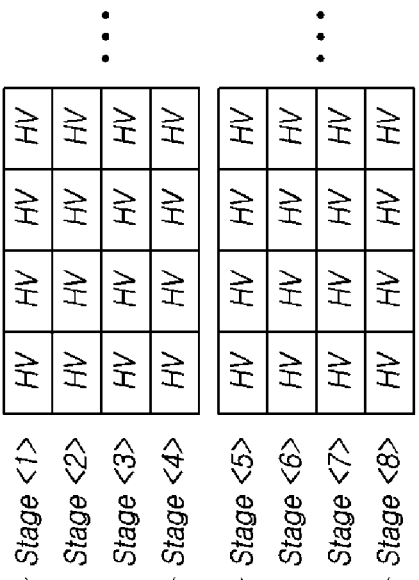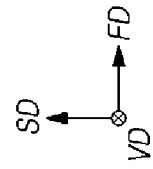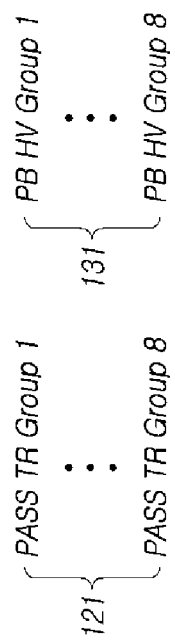
FIG.6

FIG. 7
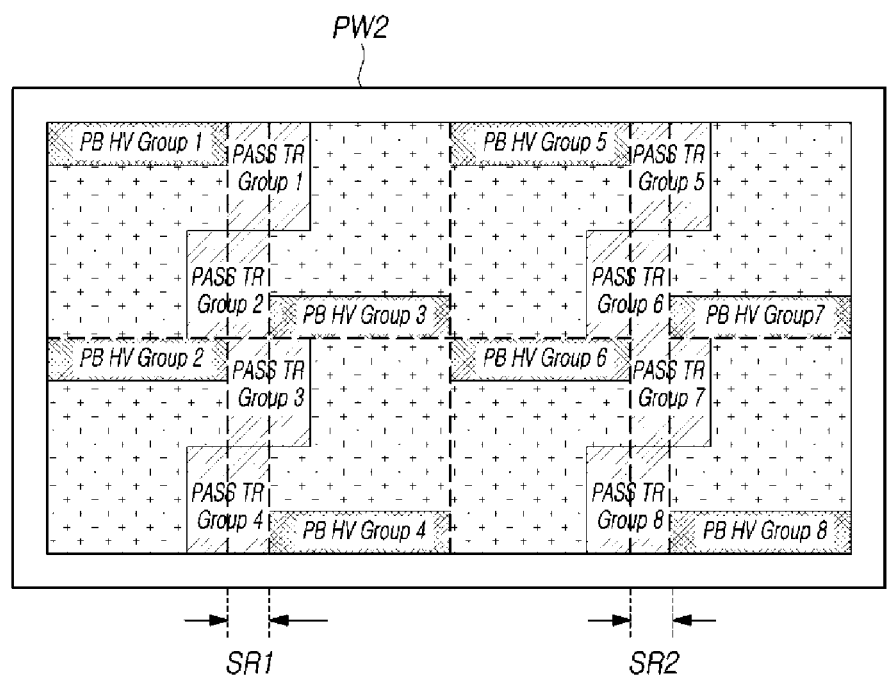
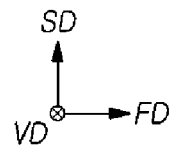

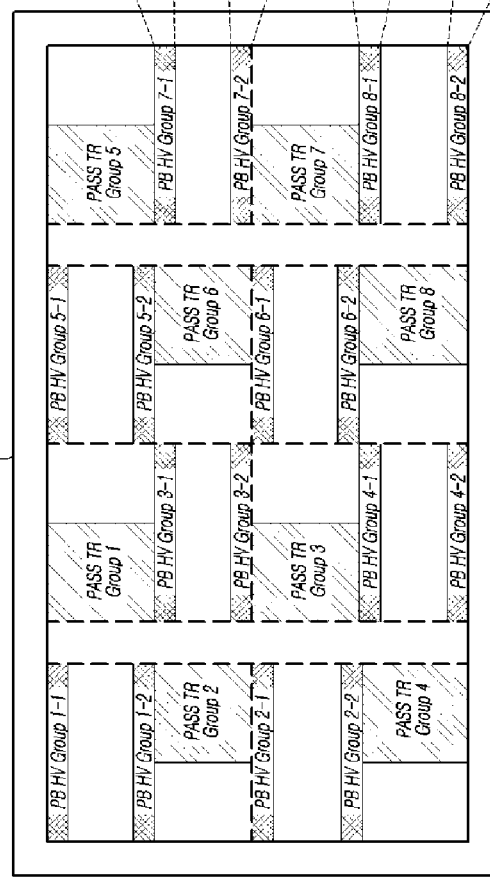
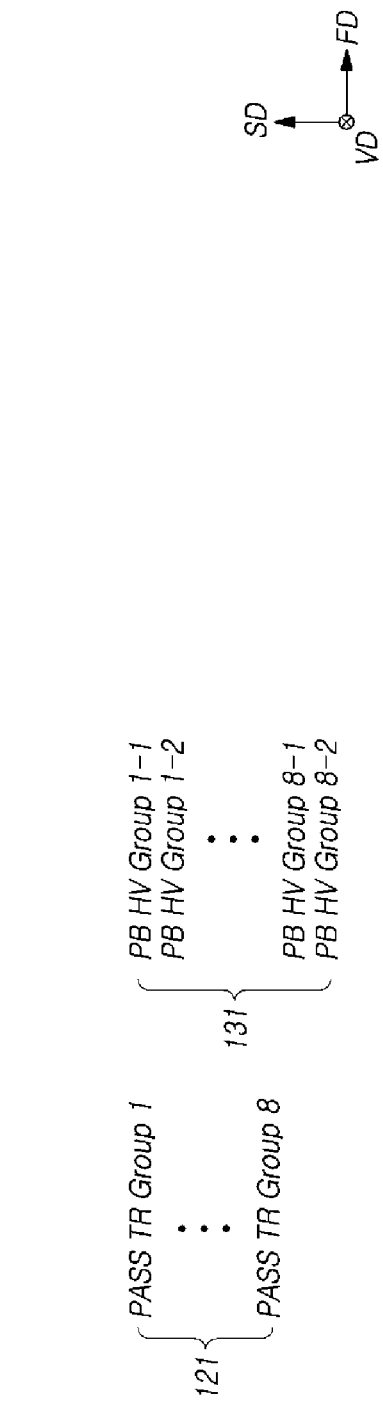
FIG.8

FIG.10
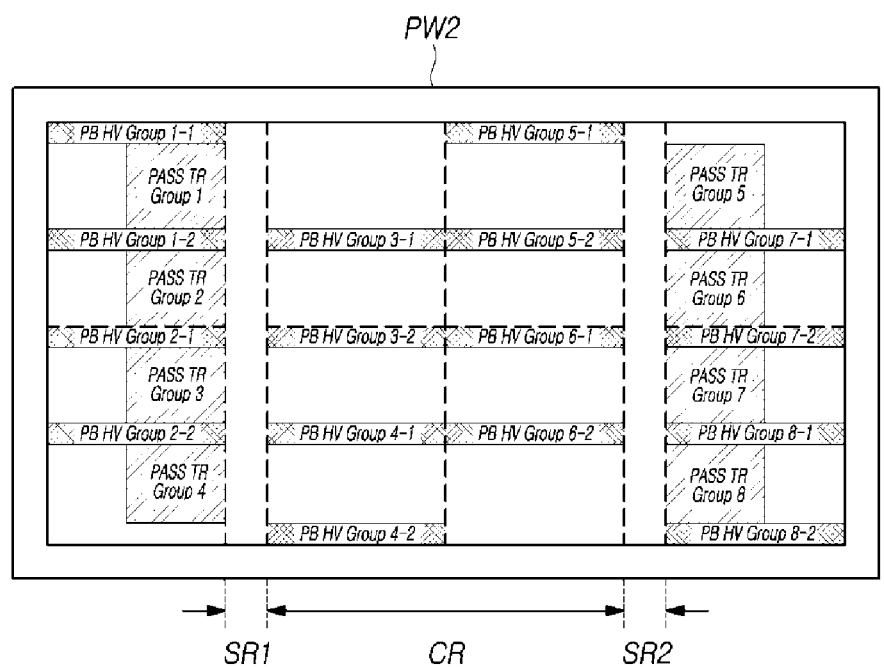
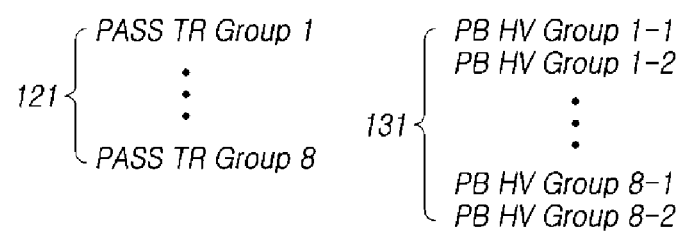
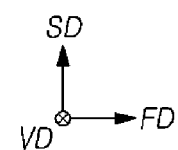

FIG.11
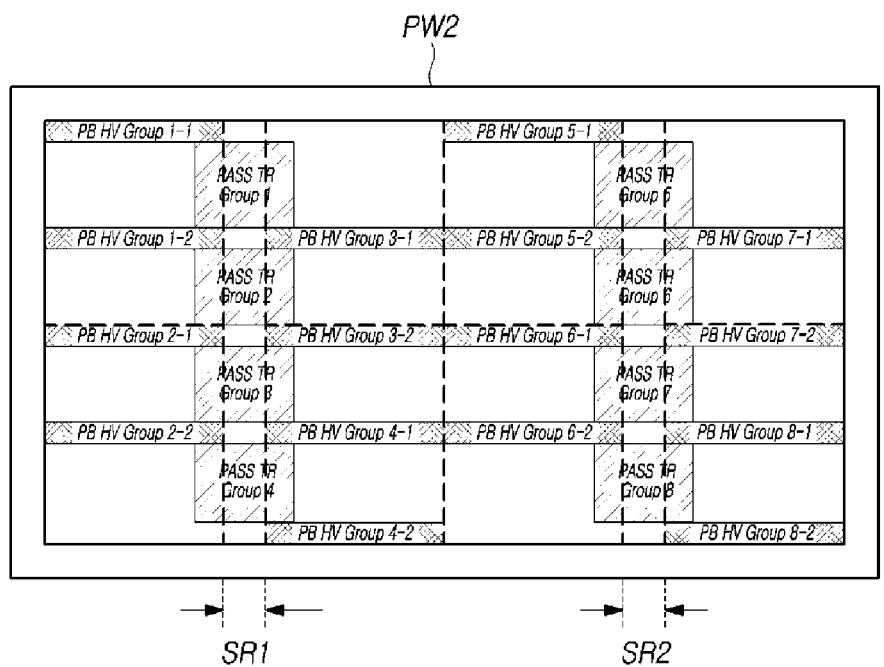
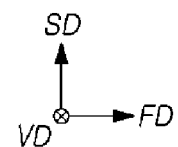

FIG.14
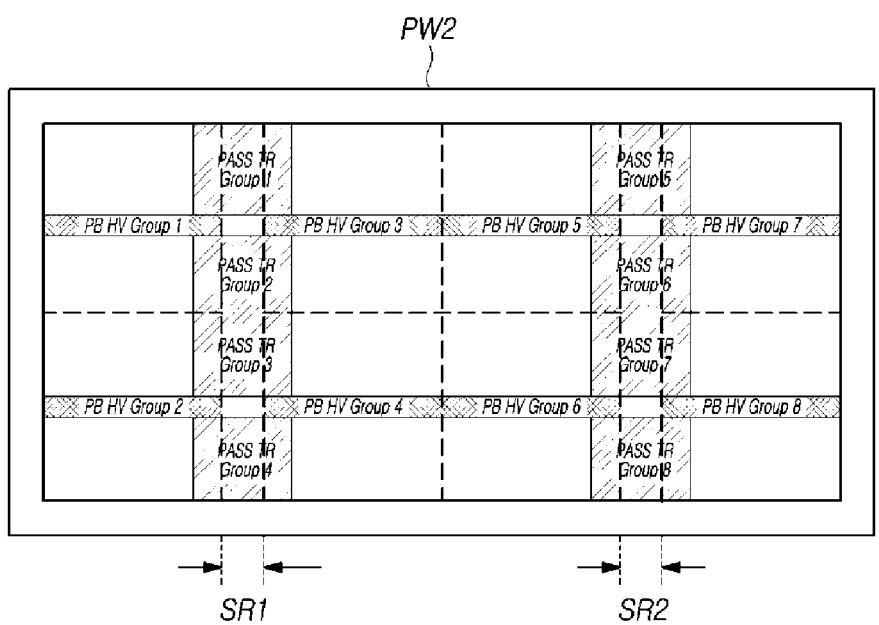
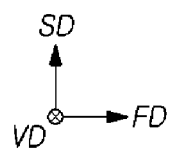

MEMORY DEVICE HAVING LOGIC CIRCUIT DISTRIBUTED ACROSS TWO PERIPHERAL WAFER

CROSS-REFERENCE TO RELATED APPLICATION

The present application claims priority under 35 U.S.C. § 119(a) to Korean Patent Application No. 10-2020-0137044 filed in the Korean Intellectual Property Office on Oct. 21, 2020, which is incorporated herein by reference in its entirety.

BACKGROUND

1. Technical Field

Various embodiments generally relate to a semiconductor technology, and particularly, to a memory device having a vertical structure.

2. Related Art

A memory device includes memory cells that have different states depending on data stored therein. The memory cells may be accessed through word lines and bit lines, and the memory device may include circuits, which are configured to access the memory cells by controlling the word lines and the bit lines. In addition, the memory device may include circuits that are configured to perform an operation requested from the outside, such as data write and read operations. In order to increase the degree of integration of the memory device, it is necessary to reduce a layout area used for disposing the circuits.

SUMMARY

Various embodiments are directed to a memory device having a vertical structure that improves the degree of integration.

In an embodiment, a memory device having a vertical structure may include: a memory cell array, defined in a cell wafer, and having a plurality of word lines extending in a first direction and arranged in a second direction, and having a plurality of bit lines extending in the second direction and arranged in the first direction; and a logic circuit, configured to control the memory cell array, that includes a page buffer low-voltage circuit, a page buffer high-voltage circuit, a row decoder circuit and a peripheral circuit, wherein the page buffer low-voltage circuit is disposed in a first peripheral wafer and the page buffer high-voltage circuit, the row decoder circuit and the peripheral circuit are disposed in a second peripheral wafer, and wherein the cell wafer overlaps with the first peripheral wafer and the second peripheral wafer in a vertical direction that is perpendicular to a plane formed by the first direction and the second direction.

In an embodiment, a memory device having a vertical structure may include: a cell wafer including a memory cell array; a first peripheral wafer including a first logic circuit which includes a plurality of first transistors and controls the memory cell array; and a second peripheral wafer including a second logic circuit which includes a plurality of second transistors and controls the memory cell array, wherein the number of kinds of thicknesses of gate dielectric layers of the first transistors is smaller than the number of kinds of thicknesses of gate dielectric layers of the second transistors.

BRIEF DESCRIPTION OF THE DRAWINGS

FIG. 4 is a top view illustrating a representation of a layout of a memory cell array of a cell wafer.

FIGS. 6 to 8, 10 to 12 and 14 are top views illustrating representations of layouts of a pass transistor circuit and a page buffer high-voltage circuit of a second peripheral circuit.

DETAILED DESCRIPTION

Figure 1:
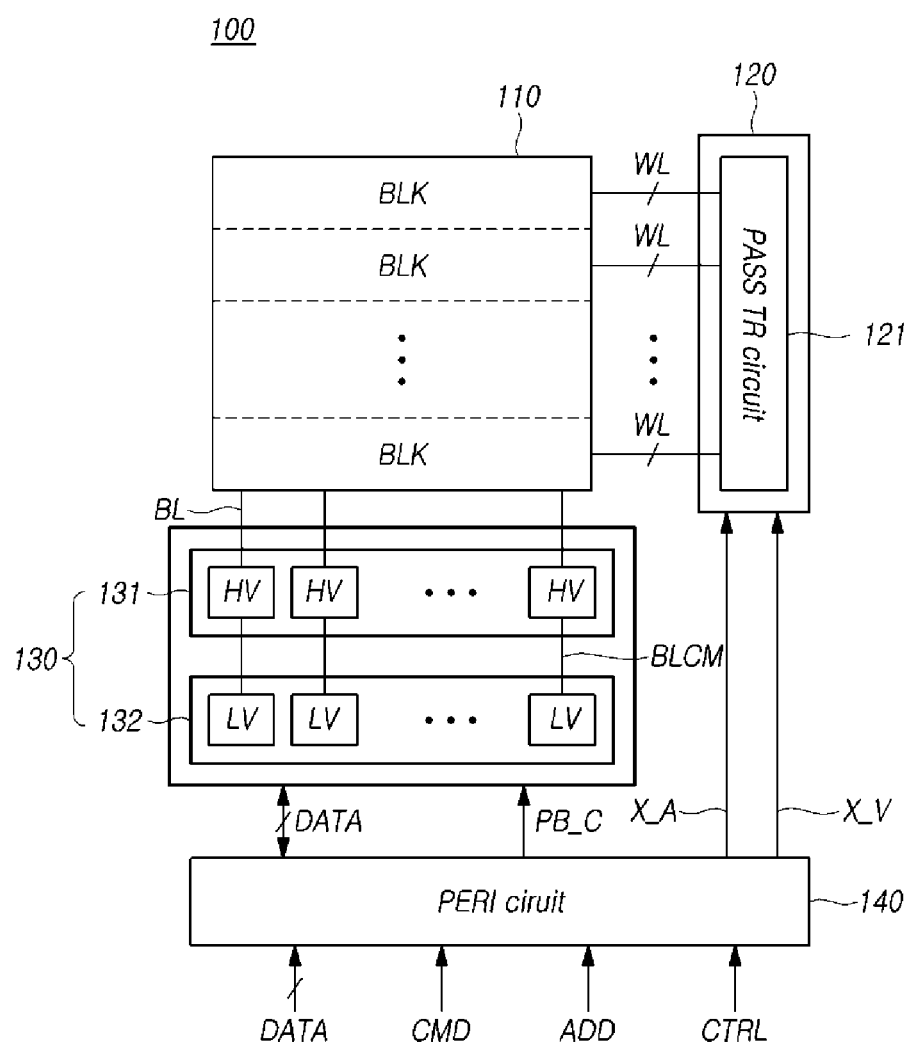
FIG. 1 is a block diagram schematically illustrating a representation of an example of a memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the present disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram schematically illustrating a representation of an example of a memory device in accordance with an embodiment of the disclosure.

Referring to FIG. 1, a memory device 100 in accordance with an embodiment of the disclosure may include a memory cell array 110 and a logic circuit for controlling the memory cell array 110. The logic circuit may include a row decoder circuit 120, a page buffer circuit 130 and a peripheral circuit (PERI circuit) 140.

The memory cell array 110 may include a plurality of memory blocks BLK. The memory blocks BLK may each include a plurality of memory cells. For example, the memory cells may be nonvolatile memory cells, and, in more detail, the memory cells may be nonvolatile memory cells based on a charge trap device.

Each of the memory blocks BLK may be coupled to the row decoder circuit 120 through a plurality of word lines WL. The row decoder circuit 120 may select any one from among the memory blocks BLK included in the memory cell array 110, in response to a row address X_A provided from the peripheral circuit 140.

The row decoder circuit 120 may transfer an operating voltage X_V, provided from the peripheral circuit 140, to word lines WL coupled to a memory block BLK selected from among the memory blocks BLK included in the memory cell array 110. In order to transfer the operating voltage X_V, the row decoder circuit 120 may include a pass transistor circuit (PASS TR circuit) 121, which is configured by a plurality of pass transistors coupled to the plurality of word lines WL, respectively, of the memory blocks BLK.

The page buffer circuit 130 may receive a page buffer control signal PB_C from the peripheral circuit 140, and may transmit and receive a data signal DATA to and from the peripheral circuit 140. The page buffer circuit 130 may control a bit line BL in response to the page buffer control signals PB_C. For example, the page buffer circuit 130 may detect data, stored in a memory cell of the memory cell array 110, by sensing a signal of the bit line BL in response to the page buffer control signal PB_C, and may transmit the data signal DATA to the peripheral circuit 140 depending on the detected data. The page buffer circuit 130 may apply a signal to the bit line BL based on the data signal DATA, received from the peripheral circuit 140, in response to the page buffer control signal PB_C, and thereby, may write data to the memory cell of the memory cell array 110. The page buffer circuit 130 may write data to or read data from memory cells, which are coupled to an activated word line.

The page buffer circuit 130 may include a page buffer high-voltage circuit 131 and a page buffer low-voltage circuit 132. The page buffer high-voltage circuit 131 may include a plurality of page buffer high-voltage units HV, which are coupled between a plurality of bit lines BL and a plurality of coupling lines BLCM.

The page buffer low-voltage circuit 132 may include a plurality of page buffer low-voltage units LV, which are coupled to the plurality of page buffer high-voltage units HV through the plurality of coupling lines BLCM. The page buffer low-voltage unit LV may include a latch (not illustrated). The page buffer low-voltage unit LV may apply a voltage to a sensing node based on data stored in the latch. The voltage applied to the sensing node may be transferred to a corresponding bit line BL through a page buffer high-voltage unit HV. The page buffer low-voltage unit LV may perform latching based on voltages transferred to the sensing node from the bit line BL through the page buffer high-voltage unit HV.

The peripheral circuit 140 may receive a command signal CMD, an address signal ADD and a control signal CTRL from a device outside the memory device 100, for example, a memory controller, and may transmit and receive data DATA to and from the device outside the memory device 100. The peripheral circuit 140 may output signals for writing data to the memory cell array 110 or reading data from the memory cell array 110, for example, the row address X_A, the page buffer control signal PB_C and so forth, based on the command signal CMD, the address signal ADD and the control signal CTRL. The peripheral circuit 140 may generate various voltages including the operating voltage X_V, which are required in the memory device 100.

Figure 2A:
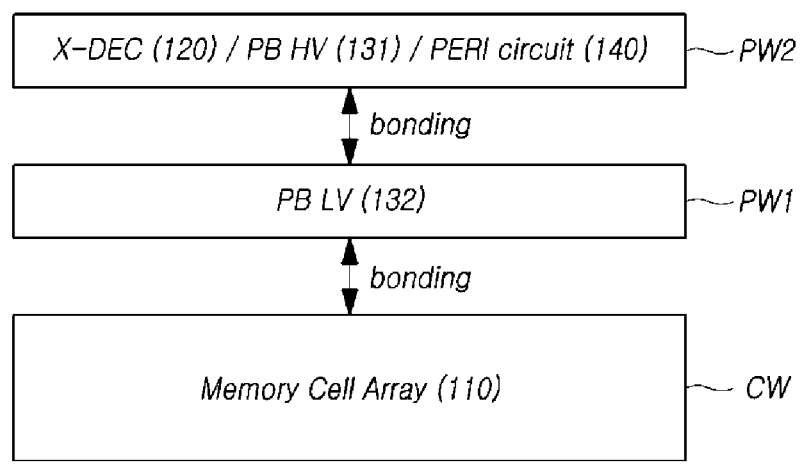
FIG. 2A is a schematic cross-sectional view illustrating a representation of an example of a memory device in accordance with an embodiment of the disclosure.
Figure 2B:
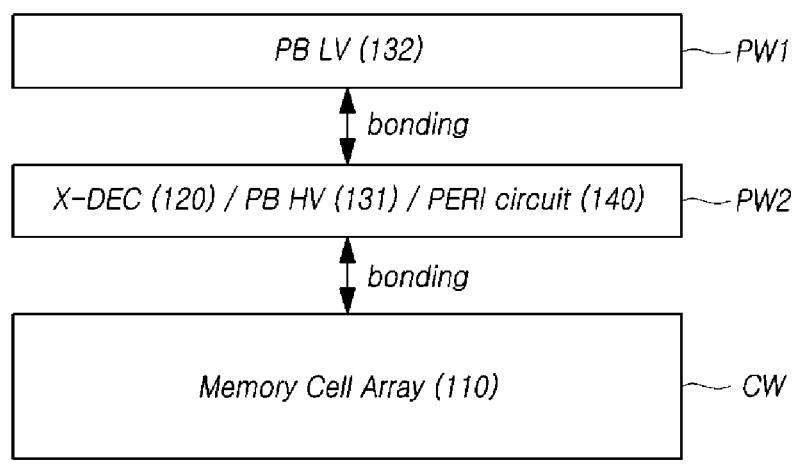
FIG. 2B is a schematic cross-sectional view illustrating a representation of an example of a memory device in accordance with another embodiment of the disclosure.

FIGS. 2A and 2B are schematic cross-sectional views illustrating representations of memory devices in accordance with embodiments of the disclosure.

Referring to FIG. 2A, a memory device in accordance with an embodiment of the disclosure may include a cell wafer CW, a first peripheral wafer PW1, which is bonded onto the cell wafer CW, and a second peripheral wafer PW2, which is bonded onto the first peripheral wafer PW1. For example, the cell wafer CW and the first peripheral wafer PW1 may be bonded to each other by a hybrid bonding technique, and the first peripheral wafer PW1 and the second peripheral wafer PW2 may be bonded to each other by a hybrid bonding technique.

In order to facilitate understanding, FIG. 2A illustrates a top surface of the cell wafer CW and a bottom surface of the first peripheral wafer PW1 separated from each other, and a top surface of the first peripheral wafer PW1 and a bottom surface of the second peripheral wafer PW2 separated from each other. However, it should be understood that the top surface of the cell wafer CW and the bottom surface of the first peripheral wafer PW1 are in contact with each other and the top surface of the first peripheral wafer PW1 and the bottom surface of the second peripheral wafer PW2 are in contact with each other.

A memory cell array 110 may be disposed in the cell wafer CW, and a page buffer low-voltage circuit (PB LV) 132 may be disposed in the first peripheral wafer PW1. A row decoder circuit (X-DEC) 120, a page buffer high-voltage circuit (PB HV) 131 and a peripheral circuit (PERI circuit) 140 may be disposed in the second peripheral wafer PW2.

Meanwhile, the bonding sequence or relative locations of the first peripheral wafer PW1 and the second peripheral wafer PW2 may be changed. As illustrated in FIG. 2B, in another embodiment, the second peripheral wafer PW2 may be bonded onto the cell wafer CW, and the first peripheral wafer PW1 may be bonded onto the second peripheral wafer PW2.

In an embodiment, it is possible to shorten the lengths of wiring lines that couple a memory cell array 110 and a row decoder circuit (X-DEC) 120 as well as the lengths of wiring lines that couple the memory cell array 110 and a page buffer high-voltage circuit (PB HV) 131 when a second peripheral wafer PW2, which includes the page buffer high-voltage circuit (PB HV) 131 and the row decoder circuit (X-DEC) 120 that directly interface with the memory cell array 110, is bonded to the cell wafer CW.

Hereinbelow, and in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may correspond to the extending direction of word lines and the arrangement direction of bit lines, and the second direction SD may correspond to the extending direction of the bit lines and the arrangement direction of the word lines. The first direction FD and the second direction SD may substantially perpendicularly intersect with each other. In the drawings, a direction indicated by an arrow and a direction opposite thereto represent the same direction.

Figure 3:
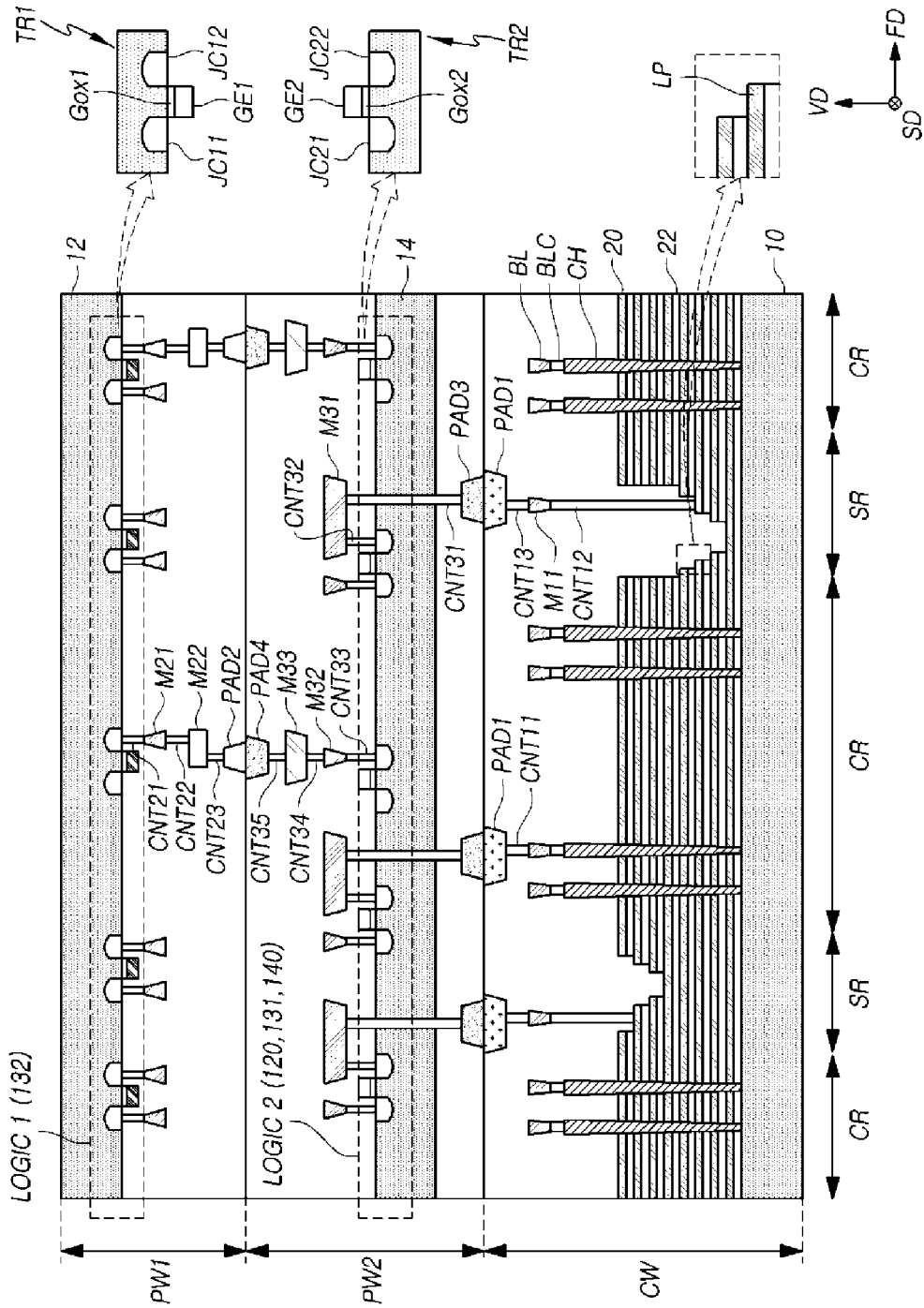
FIG. 3 is a cross-sectional view illustrating a representation of a memory device in accordance with an embodiment of the disclosure.

FIG. 3 is a cross-sectional view illustrating a representation of a memory device in accordance with an embodiment of the disclosure.

Referring to FIG. 3, a cell wafer CW may include a first substrate 10, and a plurality of electrode layers 20 and a plurality of interlayer dielectric layers 22, which are alternately stacked on the first substrate 10.

The first substrate 10 may include a semiconductor material, for example, a group IV semiconductor, a group III-V compound semiconductor or a group II-VI compound semiconductor. For example, the group IV semiconductor may include silicon, germanium or silicon-germanium. For example, the first substrate 10 may be provided as a polycrystalline layer or an epitaxial layer.

The electrode layers 20 may include a conductive material. For example, the electrode layers 20 may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Among the electrode layers 20, at least one electrode layer 20 from the lowermost electrode layer 20 may configure a source select line. Among the electrode layers 20, at least one electrode layer 20 from the uppermost electrode layer 20 may configure a drain select line. The electrode layers 20 between the source select line and the drain select line may configure word lines. The interlayer dielectric layers 22 may include silicon oxide.

The memory device may include a plurality of slimming regions SR and a plurality of cell regions CR, which are alternately disposed in the first direction FD.

An electrode layer 20 may have a pad portion LP, exposed by another electrode layer 20 positioned thereon, in at least one of the slimming regions SR. The pad portions LP of the electrode layers 20 may be distributed among and disposed in the plurality of slimming regions SR. In each slimming region SR, a staircase structure may be formed as the pad portions LP are staggered with respect to one another.

A plurality of vertical channels CH may be defined to pass, in the vertical direction VD, through the plurality of electrode layers 20 and the plurality of interlayer dielectric layers 22 alternately stacked in the cell regions CR. While not illustrated in detail, each of the vertical channels CH may include a channel layer and a gate dielectric layer. The channel layer may include polysilicon or monocrystalline silicon, and may include, in some regions thereof, a p-type impurity such as boron (B). The gate dielectric layer may have a shape that surrounds the outer wall of the channel layer. The gate dielectric layer may include a tunnel dielectric layer, a charge storage layer and a blocking layer which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

A source select transistor may be configured in areas or regions where the source select line surrounds the vertical channel CH. A memory cell may be configured in areas or regions where the word line surrounds the vertical channel CH. A drain select transistor may be configured in areas or regions where the drain select line surrounds the vertical channel CH. A source select transistor, a plurality of memory cells and a drain select transistor, which are disposed along one vertical channel CH, may configure one cell string.

A plurality of bit lines BL may be disposed over a stack including the plurality of electrode layers 20 and the plurality of interlayer dielectric layers 22. The bit lines BL may extend in the second direction SD, and may be arranged in the first direction FD. A bit line BL may be coupled to a corresponding vertical channel CH through a bit line contact BLC.

Although not illustrated, a plurality of slits may be defined by dividing the plurality of electrode layers 20 and the plurality of interlayer dielectric layers 22. Memory cells may be divided into blocks by the plurality of slits.

The cell wafer CW may include a plurality of first bonding pads PAD1 on one surface thereof. Each of the bit lines BL may be coupled to a corresponding first bonding pad PAD1 through a contact CNT11. Each of the electrode layers 20 may be coupled to a corresponding first bonding pad PAD1 through contacts CNT12 and CNT13 and a wiring line M11.

A first peripheral wafer PW1 may include a second substrate 12 and a first logic circuit LOGIC 1, which is defined under the second substrate 12.

The second substrate 12 may be a monocrystalline semiconductor layer. For example, the second substrate 12 may be a bulk silicon substrate, a silicon-on-insulator substrate, a germanium substrate, a germanium-on-insulator substrate, a silicon-germanium substrate, or an epitaxial thin film formed through selective epitaxial growth.

The first logic circuit LOGIC 1 may configure a page buffer low-voltage circuit 132. The page buffer low-voltage circuit 132 may include a plurality of first transistors TR1. A first transistor TR1 may include a gate dielectric layer Gox1, which is disposed on the bottom surface of the second substrate 12, a gate electrode GE1 which is disposed under the gate dielectric layer Gox1, and junctions JC11 and JC12, which are defined in portions of an active region of the second substrate 12 on both sides of the gate electrode GE1. The junctions JC11 and JC12 are regions that are defined by implanting an n-type or p-type impurity into portions of the active region of the second substrate 12. One of the junctions, JC11 or JC12, may be used as a source region of the first transistor TR1, and the other junction may be used as a drain region of the first transistor TR1.

The first peripheral wafer PW1 may include a plurality of second bonding pads PAD2 on the bottom surface thereof, which is bonded to a top surface of second peripheral wafer PW2. Each of the second bonding pads PAD2 may be coupled to the first logic circuit LOGIC 1 through a plurality of contacts CNT21, CNT22 and CNT23 and wiring lines M21 and M22.

The wiring lines M21 and M22 of the first peripheral wafer PW1 may be formed of a material that has relatively high resistivity but is inexpensive, for example, tungsten (W). Because the number of wiring lines that are coupled to the page buffer low-voltage circuit 132 is small, it is possible to increase the line width of the wiring lines. Therefore, even when the wiring lines M21 and M22 are formed of a material that has high resistivity, a likelihood of a functional error of the page buffer low-voltage circuit 132 caused by an RC delay is low. Thus, the wiring lines M21 and M22 may be formed of a material that has high resistivity but is also inexpensive.

The second peripheral wafer PW2 may include a third substrate 14 and a second logic circuit LOGIC 2, which is defined on the third substrate 14. The third substrate 14 may be formed of the same material as the second substrate 12.

The second logic circuit LOGIC 2 may include a row decoder circuit 120, a page buffer high-voltage circuit 131 and a peripheral circuit 140. The row decoder circuit 120, the page buffer high-voltage circuit 131 and the peripheral circuit 140 may include a plurality of second transistors TR2.

Each of the second transistors TR2 may include a gate dielectric layer Gox2, which is disposed on the third substrate 14, a gate electrode GE2, which is disposed on the gate dielectric layer Gox2, and junctions JC21 and JC22, which are defined in portions of an active region of the third substrate 14 on both sides of the gate electrode GE2. The junctions JC21 and JC22 are regions that are defined by implanting an n-type or p-type impurity into portions of the active region of the third substrate 14. One of the junctions, JC21 or JC22, may be used as a source region of the second transistor TR2, and the other junction may be used as a drain region of the second transistor TR2.

The number of kinds of the different thicknesses of the gate dielectric layers Gox1 of the first transistors TR1 is smaller than the number of kinds of the different thicknesses of the gate dielectric layers Gox2 of the second transistors TR2.

In detail, in order to configure the page buffer low-voltage circuit 132, a low-voltage transistor may be used, and a thin-film transistor and a high-voltage transistor may not be used. On the other hand, a thin-film transistor, a low-voltage transistor and a high-voltage transistor may be used to configure the row decoder circuit 120 and the peripheral circuit 140, and a high-voltage transistor may be used to configure the page buffer high-voltage circuit 131. The gate dielectric layer of the thin-film transistor, the gate dielectric layer of the low-voltage transistor and the gate dielectric layer of the high-voltage transistor may have different thicknesses. For example, there may be only one thickness of the gate dielectric layers Gox1 of the first transistors TR1, which configure the page buffer low-voltage circuit 132, but there may be three kinds of the different thicknesses of the gate dielectric layers Gox2 of the second transistors TR2, which configure the row decoder circuit 120, the page buffer high-voltage circuit 131 and the peripheral circuit 140.

The second peripheral wafer PW2 may include a plurality of third bonding pads PAD3 that are bonded to the first bonding pads PAD1, respectively, on the bottom surface thereof which is bonded to the cell wafer CW. Each of the third bonding pads PAD3 may be coupled to the second logic circuit LOGIC 2 through contacts CNT31 and CNT32 and a wiring line M31.

The second peripheral wafer PW2 may include a plurality of fourth bonding pads PAD4 that are bonded to the second bonding pads PAD2, respectively, on the top surface thereof which is bonded to the first peripheral wafer PW1. Each of the fourth bonding pads PAD4 may be coupled to the second logic circuit LOGIC 2 through a plurality of contacts CNT33, CNT34 and CNT35 and wiring lines M32 and M33.

The wiring lines M31, M32 and M33 of the second peripheral wafer PW2 may be formed of a material, for example aluminum (Al) or copper (Cu), that has lower resistivity than the wiring lines M21 and M22 of the first peripheral wafer PW1.

As the stack number of word lines is increased to increase memory capacity, the number of wiring lines that couple the word lines and the row decoder circuit 120 increases, and thus, the pitch of the wiring lines that couple the word lines and the row decoder circuit 120 decreases and becomes fine. As the bit lines BL have a fine pitch due to high integration, the pitch of wiring lines that couple the bit lines BL and the page buffer high-voltage circuit 131 also decreases and becomes finer. Due to this fact, as an RC delay occurring in the wiring lines coupled to the row decoder circuit 120 and the page buffer high-voltage circuit 131 increases, the possibility for a functional error of the second logic circuit LOGIC 2 increases. In order to prevent a functional error of the second logic circuit LOGIC 2 due to the RC delay, the wiring lines M31, M32 and M33 may be formed of a material that is expensive, but has low resistivity.

In the case where, unlike the present embodiment, circuits requiring wiring lines with a fine pitch are divisionally disposed in a first peripheral wafer and a second peripheral wafer, both the wiring lines of the first peripheral wafer and the wiring lines of the second peripheral wafer should be formed of a material which has low resistivity and is expensive, in order to prevent a functional error due to an RC delay. Therefore, the fabrication cost of a memory device may rise and the price competitiveness thereof may deteriorate. According to the disclosed embodiments, circuits that require wiring lines with a fine pitch are disposed in only the second peripheral wafer PW2, and only the page buffer low-voltage circuit 132, which does not require finely pitched wiring lines, is disposed in the first peripheral wafer PW1. Therefore, it is possible to reduce the fabrication cost of the first peripheral wafer PW1.

As a method for forming gate dielectric layers with different thicknesses on a single wafer, a method may be used in which a thick gate dielectric layer is formed on a substrate, then the thick gate dielectric layer defined in a thin gate dielectric layer forming region is removed, and then replaced with an additionally formed thin gate dielectric layer. In order to remove the thick gate dielectric layer defined in the thin gate dielectric layer forming region, a mask pattern is formed to expose the thin gate dielectric layer forming region, then an etching process removes the thick gate dielectric layer exposed by the mask pattern, and then the mask pattern remaining after the etching process may be removed by a strip process if required. As the number of kinds of the different thicknesses of gate dielectric layers to be formed in a single wafer increases, the number of steps required for fabricating the wafer may increase, thereby increasing a fabrication time and a fabrication cost and increasing a probability for a failure to occur during a fabrication process.

In contrast to embodiments disclosed herein, circuits that are configured such that not only a second peripheral wafer but also a first peripheral wafer each include high-voltage transistors, low-voltage transistors and thin-film transistors, the number of kinds of the different thicknesses of gate dielectric layers to be formed in the first peripheral wafer increases, and thus, additional cost and time will be consumed in the fabrication of the first peripheral wafer.

According to the disclosed embodiments, however, only the page buffer low-voltage circuit 132 including only low-voltage transistors is disposed in the first peripheral wafer PW1. Circuits including high-voltage transistors and thin-film transistors are not disposed in the first peripheral wafer PW1, and thus, there are fewer kinds of different thicknesses of gate dielectric layers to be formed in the first peripheral wafer PW1 as compared to the second peripheral wafer PW2. Therefore, it is possible to reduce time and costs in the fabrication of the first peripheral wafer PW1.

FIG. 4 is a top view illustrating a representation of a layout of a memory cell array of a cell wafer CW.

Referring to FIG. 4, a memory cell array 110 may be divided into four memory groups MG1 to MG4. A first memory group MG1 and a second memory group MG2 may be disposed in the first direction FD on both sides, respectively, of a first slimming region SR1, and a third memory group MG3 and a fourth memory group MG4 may be disposed on both sides in the first direction FD, respectively, of a second slimming region SR2.

In this way, the memory cell array 110 may be divided into the memory groups MG1 to MG4, the number of which is twice the number of slimming regions, and two memory groups may be paired and disposed on both sides in the first direction FD, respectively, of each corresponding slimming region.

Although not illustrated, each of the first memory group MG1 to the fourth memory group MG4 may include a plurality of bit lines.

Figure 5:
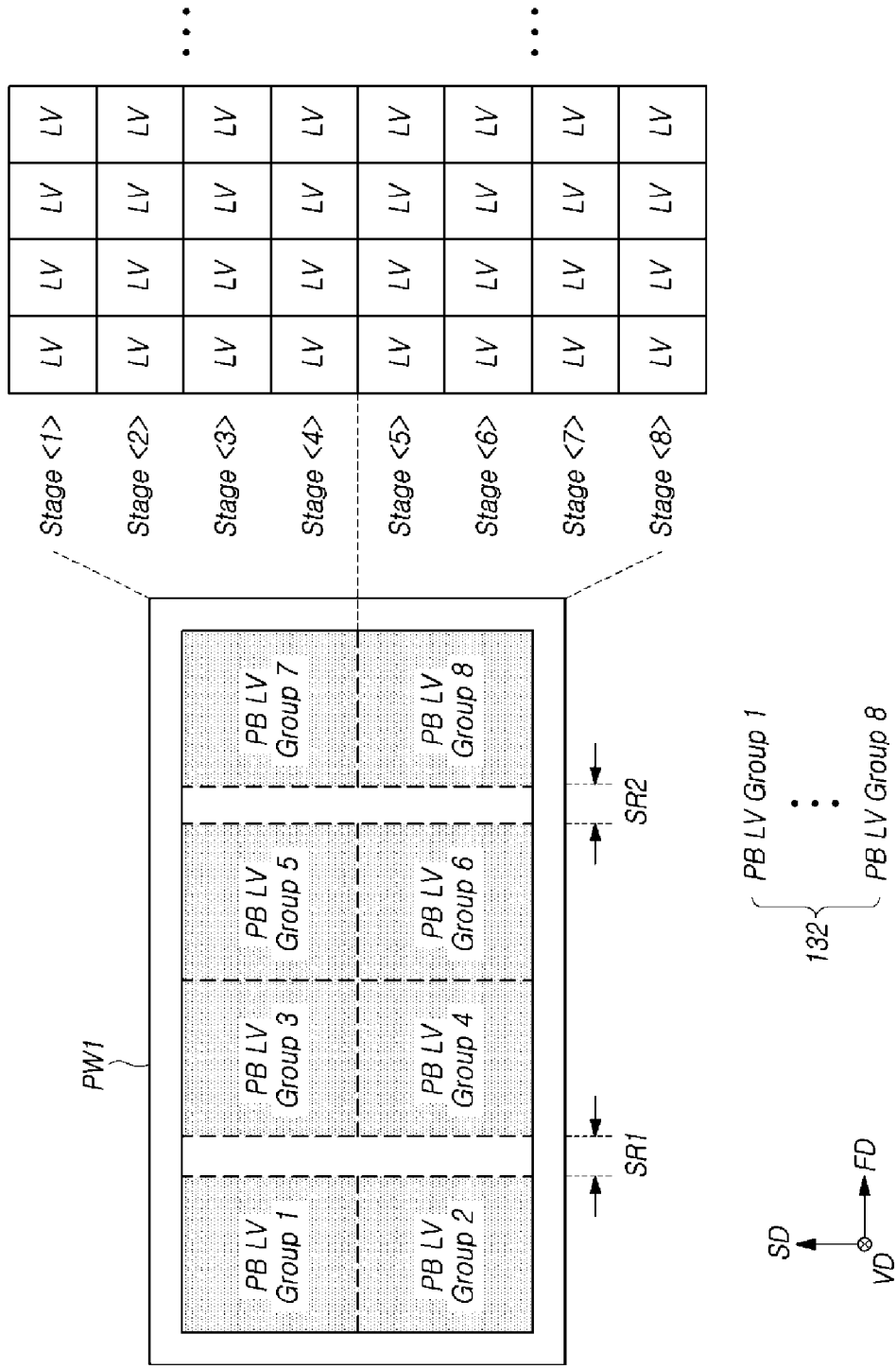
FIG. 5 is a top view illustrating a representation of a layout of a page buffer low-voltage circuit of a first peripheral wafer.

FIG. 5 is a top view illustrating a representation of a layout of a page buffer low-voltage circuit of a first peripheral wafer.

Referring to FIG. 5, a page buffer low-voltage circuit 132 may include a plurality of page buffer low-voltage units LV, which are arranged in the form of a matrix. The number of rows of the page buffer low-voltage circuit 132 may be the same as the number of data input/output pins. For example, if there are eight data input/output pins, then the page buffer low-voltage circuit 132 may be configured by eight rows, and eight page buffer low-voltage units LV may be disposed in each column of the page buffer low-voltage circuit 132.

However, it is to be noted that embodiments are not limited thereto, and the number of rows of the page buffer low-voltage circuit 132 and the number of data input/output pins may be different from each other in other embodiments. In the present specification, the number of rows will be used as the same concept as the number of stages.

The page buffer low-voltage circuit 132 may be divided into first to eighth page buffer low-voltage groups PB LV Group 1 to PB LV Group 8. As an example, it may be understood that a plurality of page buffer low-voltage units LV included in the page buffer low-voltage circuit 132 are grouped into the eight page buffer low-voltage groups PB LV Group 1 to PB LV Group 8.

The first page buffer low-voltage group PB LV Group 1 and the second page buffer low-voltage group PB LV Group 2, which are disposed in a line in the second direction SD, may correspond to a first memory group (MG1 of FIG. 4), and may overlap with the first memory group (MG1 of FIG. 4) in the vertical direction VD. The third page buffer low-voltage group PB LV Group 3 and the fourth page buffer low-voltage group PB LV Group 4, which are disposed in a line in the second direction SD, may correspond to a second memory group (MG2 of FIG. 4), and may overlap with the second memory group (MG2 of FIG. 4) in the vertical direction VD.

The fifth page buffer low-voltage group PB LV Group 5 and the sixth page buffer low-voltage group PB LV Group 6, which are disposed in a line in the second direction SD, may correspond to a third memory group (MG3 of FIG. 4), and may overlap with the third memory group (MG3 of FIG. 4) in the vertical direction VD. The seventh page buffer low-voltage group PB LV Group 7 and the eighth page buffer low-voltage group PB LV Group 8, which are disposed in a line in the second direction SD, may correspond to a fourth memory group (MG4 of FIG. 4), and may overlap with the fourth memory group (MG4 of FIG. 4) in the vertical direction VD.

For example, if the page buffer low-voltage units LV of the page buffer low-voltage circuit 132 configure eight stages, and if two page buffer low-voltage groups are disposed in a line in the second direction SD in correspondence to one memory group, then one page buffer low-voltage group may be configured by four stages.

Although the present embodiment illustrates a case in which the page buffer low-voltage circuit 132 is divided into page buffer low-voltage groups numbering twice the number of memory groups, it is to be noted that the disclosure is not limited thereto. The page buffer low-voltage circuit 132 may be divided into page buffer low-voltage groups the number of which is N times the number of memory groups (where N is a natural number). Thus, an N number of page buffer low-voltage groups may correspond to one memory group, and the N number of page buffer low-voltage groups may be disposed in a line in the second direction SD, at a position overlapping with the corresponding one memory group in the vertical direction VD.

As described above with reference to FIG. 4, a memory cell array 110 is divided into memory groups, the number of which is twice the number of slimming regions. Two memory groups are paired and disposed on both sides, respectively, of a corresponding one slimming region in the first direction FD. Thus, the page buffer low-voltage circuit 132 may be divided into page buffer low-voltage groups, the number of which is 2N times the number of slimming regions. Page buffer low-voltage groups may be disposed on both sides of a corresponding one slimming region in the first direction FD, and therefore, an N number of page buffer low-voltage groups arranged in the second direction SD may be disposed on each side of a corresponding one slimming region.

Hereinafter, various layout patterns of a pass transistor circuit and a page buffer high-voltage circuit of a second peripheral wafer will be described with reference to FIGS. 6 to 14.

Figure 9:
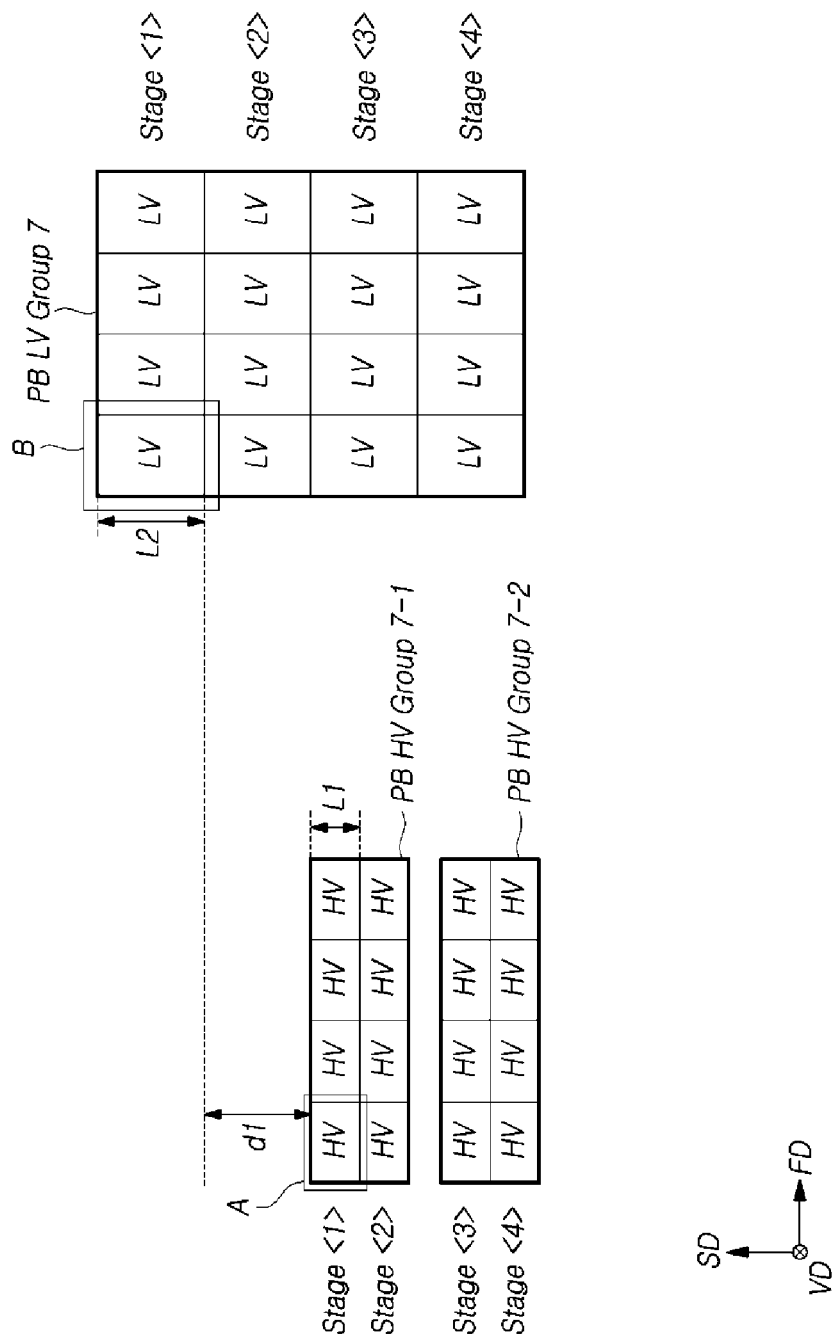
FIG. 9 is a diagram illustrating a representation of a layout of a pair of page buffer high-voltage groups illustrated in FIG. 8 and one page buffer low-voltage group corresponding thereto.

FIGS. 6 to 8, 10 to 12 and 14 are top views illustrating representations of layouts of a pass transistor circuit and a page buffer high-voltage circuit of a second peripheral wafer. FIG. 9 is a diagram illustrating a representation of a layout of a pair of page buffer high-voltage groups illustrated in FIG. 8 and one page buffer low-voltage group corresponding thereto. FIG. 13 is a diagram illustrating a representation of a layout of one page buffer high-voltage group illustrated in FIG. 12 and one page buffer low-voltage group corresponding thereto.

Referring to FIG. 6, a pass transistor circuit 121 may be divided into first to eighth pass transistor groups PASS TR Group 1 to PASS TR Group 8. For example, it may be understood that a plurality of pass transistors included in the pass transistor circuit 121 are grouped into the eight pass transistor groups PASS TR Group 1 to PASS TR Group 8.

Although not illustrated in FIG. 6, pad portions (LP of FIG. 3) of word lines may be positioned in a first slimming region SR1 and a second slimming region SR2. The first to fourth pass transistor groups PASS TR Group 1 to PASS TR Group 4 may be disposed at positions adjacent to the first slimming region SR1, and the pass transistors of the first to fourth pass transistor groups PASS TR Group 1 to PASS TR Group 4 may be coupled to the pad portions, respectively, disposed in the first slimming region SR1. For example, the first to fourth pass transistor groups PASS TR Group 1 to PASS TR Group 4 may be arranged in a zigzag style with respect to the first slimming region SR1 in the second direction SD, which is a direction in which the word lines are arranged.

The fifth to eighth pass transistor groups PASS TR Group 5 to PASS TR Group 8 may be disposed at positions adjacent to the second slimming region SR2, and the pass transistors of the fifth to eighth pass transistor groups PASS TR Group 5 to PASS TR Group 8 may be coupled to the pad portions (LP of FIG. 3) of word lines, respectively, disposed in the second slimming region SR2. For example, the fifth to eighth pass transistor groups PASS TR Group 5 to PASS TR Group 8 are arranged in a zigzag style with respect to the second slimming region SR2 in the second direction SD.

Although FIG. 6 illustrates a pass transistor circuit 121 divided into pass transistor groups, the number of which is four times the number of slimming regions, it is to be noted that the disclosure is not limited thereto. In other embodiments, the pass transistor circuit 121 may be divided into pass transistor groups of a number that is the same as the number of page buffer low-voltage groups, that is, 2N times the number of slimming regions. A pass transistor group may be disposed to overlap, in the vertical direction, with one of the plurality of page buffer low-voltage groups. The pass transistor group may be disposed to abut an edge of a corresponding one of the plurality of slimming regions, and an edge of the pass transistor group may be disposed to overlap, in the vertical direction, an edge of the one of the plurality of page buffer low-voltage groups, and an edge of the one of the plurality of page buffer high-voltage groups may be disposed to overlap, in the vertical direction, with an edge of the corresponding page buffer low-voltage group that is opposite to the edge of the corresponding page buffer low-voltage group that overlaps with the edge of the pass transistor group. An edge of the pass transistor group and an edge of the one of the plurality of page buffer high-voltage groups may abut the same edge of the corresponding slimming region.

A page buffer high-voltage circuit 131 may be divided into page buffer high-voltage groups PB HV Group 1 to PB HV Group 8, the number of which is same as the number of the page buffer low-voltage groups, and each page buffer high-voltage group may be disposed to overlap with a corresponding one page buffer low-voltage group in the vertical direction VD. In this case, the number of stages of a page buffer high-voltage group may be the same as the number of stages of one page buffer low-voltage group.

FIG. 6 illustrates the page buffer high-voltage circuit 131 divided into first to eighth page buffer high-voltage groups PB HV Group 1 to PB HV Group 8 that correspond respectively to first to eighth page buffer low-voltage groups PB LV Group 1 to PB LV Group 8 of FIG. 5.

The first and second page buffer high-voltage groups PB HV Group 1 and PB HV Group 2 may be coupled to bit lines of a first memory group (MG1 of FIG. 4). The first page buffer high-voltage group PB HV Group 1 may be coupled to a first page buffer low-voltage group (PB LV Group 1 of FIG. 5) through coupling lines, and the second page buffer high-voltage group PB HV Group 2 may be coupled to a second page buffer low-voltage group (PB LV Group 2 of FIG. 5) through coupling lines.

The third and fourth page buffer high-voltage groups PB HV Group 3 and PB HV Group 4 may be coupled to bit lines of a second memory group (MG2 of FIG. 4). The third page buffer high-voltage group PB HV Group 3 may be coupled to a third page buffer low-voltage group (PB LV Group 3 of FIG. 5) through coupling lines, and the fourth page buffer high-voltage group PB HV Group 4 may be coupled to a fourth page buffer low-voltage group (PB LV Group 4 of FIG. 5) through coupling lines.

The fifth and sixth page buffer high-voltage groups PB HV Group 5 and PB HV Group 6 may be coupled to bit lines of a third memory group (MG3 of FIG. 4). The fifth page buffer high-voltage group PB HV Group 5 may be coupled to a fifth page buffer low-voltage group (PB LV Group 5 of FIG. 5) through coupling lines, and the sixth page buffer high-voltage group PB HV Group 6 may be coupled to a sixth page buffer low-voltage group (PB LV Group 6 of FIG. 5) through coupling lines.

The seventh and eighth page buffer high-voltage groups PB HV Group 7 and PB HV Group 8 may be coupled to bit lines of a fourth memory group (MG4 of FIG. 4). The seventh page buffer high-voltage group PB HV Group 7 may be coupled to a seventh page buffer low-voltage group (PB LV Group 7 of FIG. 5) through coupling lines, and the eighth page buffer high-voltage group PB HV Group 8 may be coupled to an eighth page buffer low-voltage group (PB LV Group 8 of FIG. 5) through coupling lines.

The first page buffer high-voltage group PB HV Group 1 may overlap with the first memory group (MG1 of FIG. 4) and the first page buffer low-voltage group (PB LV Group 1 of FIG. 5) in the vertical direction VD, and may be disposed to elongate or extend in the first direction FD, which is a direction in which the bit lines are arranged. The dimension of the first page buffer high-voltage group PB HV Group 1 in the first direction FD may be substantially the same as that of the first memory group (MG1 of FIG. 4) in the first direction FD and that of the first page buffer low-voltage group (PB LV Group 1 of FIG. 5) in the first direction FD.

The second to eighth page buffer high-voltage groups PB HV Group 2 to PB HV Group 8 may also be configured and disposed in a manner similar to that of the first page buffer high-voltage group PB HV Group 1 as described above.

The dimension of one pass transistor group in the second direction SD is smaller than that of one page buffer low-voltage group in the second direction SD, and the dimension of one page buffer high-voltage group in the second direction SD is smaller than that of one page buffer low-voltage group in the second direction SD.

As described above, the pass transistor circuit 121 may be disposed by being divided into a plurality of pass transistor groups each having a dimension in the second direction SD that is smaller than the dimension of a page buffer low-voltage group in the second direction SD, and the page buffer high-voltage circuit 131 may be disposed by being divided into a plurality of page buffer high-voltage groups each having a dimension in the second direction SD that is smaller than the dimension of the page buffer low-voltage group in the second direction SD. Thus, it is possible to lay out the pass transistor groups and the page buffer high-voltage groups on a single plane without overlap and without interfering with each other.

Referring to FIG. 7, at least a portion of each of the pass transistor groups PASS TR Group 1 to PASS TR Group 4 may be positioned in the first slimming region SR1, and first to fourth pass transistor groups PASS TR Group 1 to PASS TR Group 4 may be offset from each other in the second direction SD and disposed in a zigzag style with respect to a first slimming region SR1.

Similarly, at least a portion of each of the pass transistor groups PASS TR Group 5 to PASS TR Group 8 may be positioned in the second slimming region SR2, and fifth to eighth pass transistor groups PASS TR Group 5 to PASS TR Group 8 may be offset from each other in the second direction SD and disposed in a zigzag style with respect to a second slimming region SR2.

FIG. 7 illustrates a pass transistor group with a dimension in the first direction FD that is larger than the dimension of a slimming region in the first direction FD. In other embodiments, if a dimension of a pass transistor group in the first direction FD is the same as or smaller than the dimension of a slimming region in the first direction FD, then the entire pass transistor group may be disposed in the corresponding slimming region. FIG. 7 also illustrates an edge of the pass transistor group and an edge of the one of the plurality of page buffer high-voltage groups may abut opposite edges of the corresponding slimming region.

As described above, at least a portion of each of the pass transistor groups PASS TR Group 1 to PASS TR Group 8 is disposed in a slimming region. If, in a comparative example, the entirety of each of the pass transistor groups PASS TR Group 1 to PASS TR Group 8 is disposed outside the slimming region, then the area of a continuous region (a region hatched with crosses in FIG. 7), which is not utilized for disposing the page buffer high-voltage groups PB HV Group 1 to PB HV Group 8 and the pass transistor groups PASS TR Group 1 to PASS TR Group 8, may need to increase in order to accommodate a peripheral circuit (140 of FIG. 1) disposed in such a region.

For example, among circuits included in the peripheral circuit, there may be a circuit that needs to be disposed in a relatively wide continuous space. Such a circuit may have a portion that does not overlap with a memory cell array (110 of FIG. 4) in the vertical direction VD. Accordingly, in the comparative example, the area of the second peripheral wafer PW2 may increase, and the size of a memory device may increase.

According to the disclosed embodiments, however, at least a portion of each pass transistor group is positioned in a slimming region, so it is possible to provide a wider or larger continuous region which is not utilized for disposing the page buffer high-voltage groups PB HV Group 1 to PB HV Group 8 and the pass transistor groups PASS TR Group 1 to PASS TR Group 8. By disposing the peripheral circuit in such a region, it is possible to reduce the size of the second peripheral wafer PW2.

Referring to FIG. 8, a page buffer high-voltage circuit 131 may be divided into page buffer high-voltage groups PB HV Group 1-1 to PB HV Group 8-2. The number of page buffer high-voltage groups may be twice the number of page buffer low-voltage groups. Two page buffer high-voltage groups may be disposed to be spaced apart from each other in the second direction SD. The two page buffer high-voltage groups may be paired and overlap with a corresponding one page buffer low-voltage group in the vertical direction VD.

In FIG. 8, the number of stages of one page buffer high-voltage group may be half the number of stages of one page buffer low-voltage group. For example, if one page buffer low-voltage group is configured by four stages (see FIG. 5), then each of the page buffer high-voltage groups PB HV Group 1-1 to PB HV Group 8-2 may be configured by two stages.

Referring to FIG. 9, the dimension of a page buffer high-voltage unit HV in the second direction SD is L1, which is shorter than dimension L2 of a page buffer low-voltage unit LV in the second direction SD. Due to the difference between L1 and L2, the page buffer high-voltage unit HV and the page buffer low-voltage unit LV, which are coupled to each other through a coupling line, may be disposed to be separated from each other in the second direction SD.

For example, a page buffer high-voltage unit HV in a box A and a page buffer low-voltage unit LV in a box B may be coupled to each other through a coupling line, and may be disposed to be separated from each other by a distance d1 in the second direction SD.

If the page buffer high-voltage group PB HV Group 7-1 is not spaced apart from the page buffer high-voltage group PB HV Group 7-2, but instead is disposed to be in contact with the page buffer high-voltage group PB HV Group 7-2, the magnitude of the distance d1 increases, and thus, a longer coupling line needs to be used to couple the page buffer high-voltage unit HV in the box A and the page buffer low-voltage unit LV in the box B.

According to the embodiment illustrated in FIG. 8, however, two page buffer high-voltage groups (e.g., PB HV Group 7-1 and PB HV Group 7-2) corresponding to one page buffer low-voltage group (e.g., PB LV Group 7 of FIG. 5) are disposed to be spaced apart from each other in the second direction SD. Thus, it is possible to reduce the distance d1 between the page buffer high-voltage unit HV and the page buffer low-voltage unit LV corresponding to each other, and therefore possible to shorten the length of a coupling line used to couple the page buffer high-voltage unit HV and the page buffer low-voltage unit LV corresponding to each other.

Referring to FIG. 10, first to eighth pass transistor groups PASS TR Group 1 to PASS TR Group 8 may be disposed outside of a first slimming region SR1, a second slimming region SR2 and a cell region CR between the first slimming region SR1 and the second slimming region SR2.

In detail, the first to fourth pass transistor groups PASS TR Group 1 to PASS TR Group 4 may be disposed in a line in the second direction SD, and disposed in a region opposite to the cell region CR with respect to the first slimming region SR1 in the first direction FD. The fifth to eighth pass transistor groups PASS TR Group 5 to PASS TR Group 8 may be disposed in a line in the second direction SD, and disposed in a region opposite to the cell region CR with respect to the second slimming region SR2 in the first direction FD. Thus, the first to fourth pass transistor groups PASS TR Group 1 to PASS TR Group 4 may be disposed to be separated from the fifth to eighth pass transistor groups PASS TR Group 5 to PASS TR Group 8 in the first direction FD, and may be separated by the first slimming region SR1, the cell region CR and the second slimming region SR2 interposed therebetween. In FIG. 10, the page buffer high-voltage circuit includes a plurality of page buffer high-voltage groups PB HV Group 1-1 to PB HV Group 8-2 that may include page buffer high-voltage groups that number two times the number of the page buffer low-voltage groups in the plurality of page buffer low-voltage groups PB LV Group 1 to PB LV Group 8 of FIG. 5. The first 2N number of pass transistor groups PASS TR Group 1 to PASS TR Group 4 may be disposed, in a top view, to alternate with a first 2N number of page buffer high-voltage groups PB HV Group 1-1 to PB HV Group 2-2 in the second direction SD, and, in a top view, the second 2N number of pass transistor groups PASS TR Group 5 to PASS TR Group 8 may be disposed to alternate with a second 2N number of page buffer high-voltage groups PB HV Group 7-1 to PB HV Group 8-2 in the second direction SD.

In this way, the pass transistor groups PASS TR Group 1 to PASS TR Group 8 are disposed outside the first slimming region SR1, the cell region CR and the second slimming region SR2, which are continuously arranged in the first direction FD. Consequently, a relatively wide continuous region that is not utilized for disposing page buffer high-voltage groups PB HV Group 1 to PB HV Group 8 and the pass transistor groups PASS TR Group 1 to PASS TR Group 8 may be provided. A peripheral circuit that needs to be disposed in a relatively wide continuous space may be disposed in such a region. Therefore, an increase in the area of the second peripheral wafer PW2 due to the presence of a peripheral circuit may be suppressed or avoided.

Referring to FIG. 11, first to fourth pass transistor groups PASS TR Group 1 to PASS TR Group 4 may be disposed in a line in the second direction SD. In the first direction FD, the centers of the first to fourth pass transistor groups PASS TR Group 1 to PASS TR Group 4 may be aligned with the centerline, extending in the second direction SD, of a first slimming region SR1.

Fifth to eighth pass transistor groups PASS TR Group 5 to PASS TR Group 8 may be disposed in a line in the second direction SD. In the first direction FD, the centers of the fifth to eighth pass transistor groups PASS TR Group 5 to PASS TR Group 8 may be aligned with the centerline, extending in the second direction SD, of a second slimming region SR2. FIG. 11 illustrates that the page buffer high-voltage circuit 131 may include a plurality of page buffer high-voltage groups PB HV Group 1-1 to PB HV Group 8-2 that includes page buffer high-voltage groups that number two times the number of the page buffer low-voltage groups in the plurality of page buffer low-voltage groups (PB LV Group 1 to PB LV Group 8 of FIG. 5). The first to fourth pass transistor groups PASS TR Group 1 to PASS TR 4 may be disposed, in a top view, to alternate with page buffer high-voltage groups PB HV Group 1-1 to PB HV Group 2-2 along one edge of the first slimming region SR1 in the second direction SD. And the first to fourth pass transistor groups PASS TR Group 1 to PASS TR 4 may be disposed, in a top view, to alternate with page buffer high-voltage groups PB HV Group 3-1 to PB HV Group 4-2 along the other edge of the first slimming region SR1 in the second direction SD. The fifth to eighth pass transistor groups PASS TR Group 5 to PASS TR 8 may be disposed, in a top view, to alternate with page buffer high-voltage groups PB HV Group 5-1 to PB HV Group 6-2 along one edge of the second slimming region SR2 in the second direction SD. And, the fifth to eighth pass transistor groups PASS TR Group 5 to PASS TR 8 may be disposed, in a top view, to alternate with page buffer high-voltage groups PB HV Group 7-1 to PB HV Group 8-2 along the other edge of the second slimming region SR2 in the second direction SD.

As described above with reference to FIG. 6, the pass transistors of the first to fourth pass transistor groups PASS TR Group 1 to PASS TR Group 4 are coupled to the pad portions, respectively, of the first slimming region SR1. Therefore, in order to shorten the length of a wiring line used to couple a pass transistor and a pad portion corresponding thereto, it is necessary to dispose the pass transistor in the first slimming region SR1, or to reduce the distance between the pass transistor and the first slimming region SR1 as much as possible if the pass transistor is disposed outside of the first slimming region SR1.

The dimension of the first to fourth pass transistor groups PASS TR Group 1 to PASS TR Group 4 in the first direction FD may correspond to the dimension, in the first direction FD, of a region that is occupied by the pass transistors included in the first to fourth pass transistor groups PASS TR Group 1 to PASS TR Group 4.

As the number of word lines increases, the number of pass transistors included in the first to fourth pass transistor groups PASS TR Group 1 to PASS TR Group 4 increases, and the dimension, in the first direction FD, of the region that is occupied by the pass transistors of the first to fourth pass transistor groups PASS TR Group 1 to PASS TR Group 4, that is, the dimension of the first to fourth pass transistor groups PASS TR Group 1 to PASS TR Group 4 in the first direction FD, increases. Thus, the dimension of the first to fourth pass transistor groups PASS TR Group 1 to PASS TR Group 4 in the first direction FD may become larger than the dimension of the first slimming region SR1 in the first direction FD. In this case, it is impossible to dispose all the pass transistors that are included in the first to fourth pass transistor groups PASS TR Group 1 to PASS TR Group 4 into the first slimming region SR1, and some pass transistors may be disposed outside the first slimming region SR1.

If the first to fourth pass transistor groups PASS TR Group 1 to PASS TR Group 4 are disposed to be offset, for example by being shifted in the first direction FD with respect to the centerline of the first slimming region SR1, a wiring line with a longer length may need to be used to couple a pass transistor, offset in a direction away from the first slimming region SR1, to a pad portion. If the length of a wiring line increases, then the performance of a memory device may degrade as RC delay increases.

According to embodiments of the disclosure, the centers of the first to fourth pass transistor groups PASS TR Group 1 to PASS TR Group 4 in the first direction FD are aligned with the centerline, extending in the second direction SD, of the first slimming region SR1. Therefore, the first to fourth pass transistor groups PASS TR Group 1 to PASS TR Group 4 may be centered and disposed without being lopsided to either side with respect to the centerline of the first slimming region SR1. Accordingly, the distance between a pass transistor, which is separated farthest from the first slimming region SR1, and the first slimming region SR1 may be shortened, and thus, it is possible to shorten the length of a wiring line used to couple the pass transistor and a pad portion positioned in the first slimming region SR1.

Figure 12:
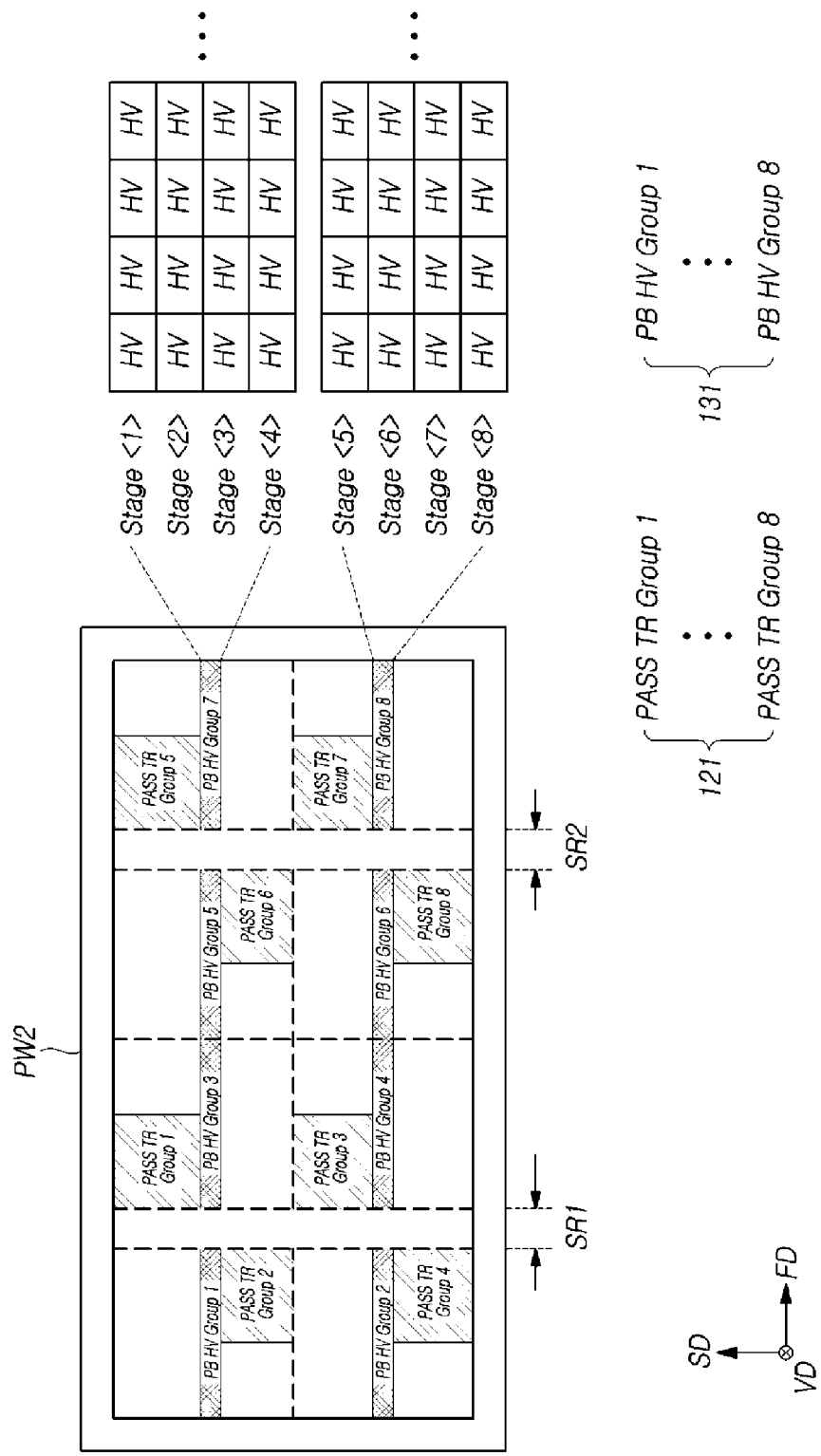
Figure 13:
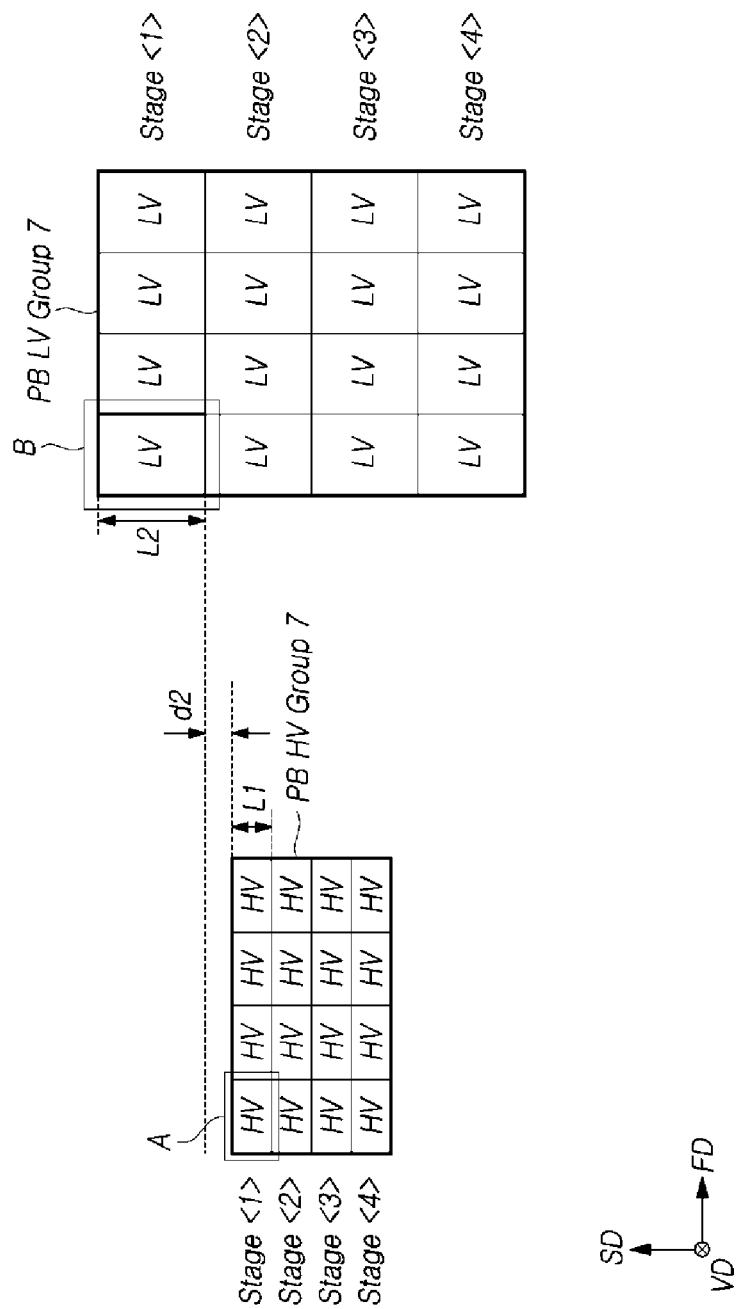
FIG. 13 is a diagram illustrating a representation of a layout of one page buffer high-voltage group illustrated in FIG. 12 and one page buffer low-voltage group corresponding thereto.

Referring to FIG. 12, the center of each of first to eighth page buffer high-voltage groups PB HV Group 1 to PB HV Group 8 in the second direction SD may be aligned with the centerline, extending in the first direction FD, of a corresponding page buffer low-voltage group. For example, the center of the first page buffer high-voltage group PB HV Group 1 in the second direction SD may be aligned with the centerline, extending in the first direction FD, of a first page buffer low-voltage group (PB LV Group 1 of FIG. 5). In FIG. 12, the row decoder circuit 121 includes a pass transistor circuit and the pass transistor circuit may include a plurality of pass transistor groups PASS TR Group 1 to PASS TR Group 8 that includes pass transistor groups that number 2N times the number of the slimming regions SR1 and SR2. A pass transistor group may be disposed to overlap, in the vertical direction VD, with one of the plurality of page buffer low-voltage groups (PB LV Group 1 to PB LV Group 8 of FIG. 5) that corresponds to one of the plurality of high-voltage groups PB HV Group 1 to PB HV Group 8. The pass transistor group may be disposed to abut an edge of a corresponding one of the plurality of slimming regions that is common to an edge of the one of the page buffer low-voltage groups (PB LV Group 1 to PB LV Group 8 of FIG. 5), and another edge of the pass transistor group may be disposed to overlap, in the vertical direction VD, another adjacent edge of the one of the page buffer low-voltage groups (PB LV Group 1 to PB LV Group 8 of FIG. 5).

Referring to FIG. 13, a dimension L1 of a page buffer high-voltage unit HV in the second direction SD and a dimension L2 of a page buffer low-voltage unit LV in the second direction SD are different from each other. As a result, the page buffer high-voltage unit HV and the page buffer low-voltage unit LV, which are coupled to each other through a coupling line, may be disposed to be separated from each other in the second direction SD.

For example, a page buffer high-voltage unit HV in a box A and a page buffer low-voltage unit LV in a box B may be coupled to each other through a coupling line, and may be disposed to be separated from each other by a distance d2 in the second direction SD.

If the page buffer high-voltage group PB HV Group 7 is shifted in the second direction SD towards alignment with the end of the page buffer low-voltage group PB LV Group 7 in the second direction SD, then the size of the distance d2 increases. Thus, a coupling line with a longer length needs to be used to couple the page buffer high-voltage unit HV in the box A and the page buffer low-voltage unit LV in the box B.

According to the embodiment illustrated in FIG. 12, however, the center of each page buffer high-voltage group in the second direction SD is aligned with the centerline, extending in the first direction FD, of a corresponding page buffer low-voltage group. Thus, it is possible to reduce the distance d2 between the page buffer high-voltage unit HV and the page buffer low-voltage unit LV corresponding to each other, and to shorten the length of a coupling line used to couple the page buffer high-voltage unit HV and the page buffer low-voltage unit LV.

Referring to FIG. 14, first to eighth pass transistor groups PASS TR Group 1 to PASS TR Group 8 may be disposed in the same manner as the first to eighth pass transistor groups PASS TR Group 1 to PASS TR Group 8 described above with reference to FIG. 11. That is to say, the first to fourth pass transistor groups PASS TR Group 1 to PASS TR Group 4 may be disposed in a line in the second direction SD, and in the first direction FD, the centers of the first to fourth pass transistor groups PASS TR Group 1 to PASS TR Group 4 may be aligned with the centerline, extending in the second direction SD, of a first slimming region SR1. The fifth to eighth pass transistor groups PASS TR Group 5 to PASS TR Group 8 may be disposed in a line in the second direction SD, and in the first direction FD, the centers of the fifth to eighth pass transistor groups PASS TR Group 5 to PASS TR Group 8 may be aligned with the centerline, extending in the second direction SD, of a second slimming region SR1.

First to eighth page buffer high-voltage groups PB HV Group 1 to PB HV Group 8 may be disposed in the same manner as the first to eighth page buffer high-voltage groups PB HV Group 1 to PB HV Group 8 described above with reference to FIG. 12. In other words, the center of each of first to eighth page buffer high-voltage groups PB HV Group 1 to PB HV Group 8 in the second direction SD may be aligned with the centerline, extending in the first direction FD, of a corresponding page buffer low-voltage group. In FIG. 14, a center of each of first to forth pass transistor groups PASS TR Group 1 to PASS TR Group 4 may be aligned with a centerline, extending in the second direction SD, of the first slimming region SR1. And, a center of each of fifth to eighth pass transistor groups PASS TR Group 5 to PASS TR Group 8 may be aligned with a centerline, extending in the second direction SD, of the second slimming region SR2.

According to the present embodiment, it is possible to shorten the length of each of the wiring lines used to couple the pass transistor groups PASS TR Group 1 to PASS TR Group 8 and the pad portions of the slimming regions SR1 and SR2, and also, it is possible to shorten the length of a wiring line used to couple the page buffer high-voltage unit HV and the page buffer low-voltage unit LV.

Figure 15A:
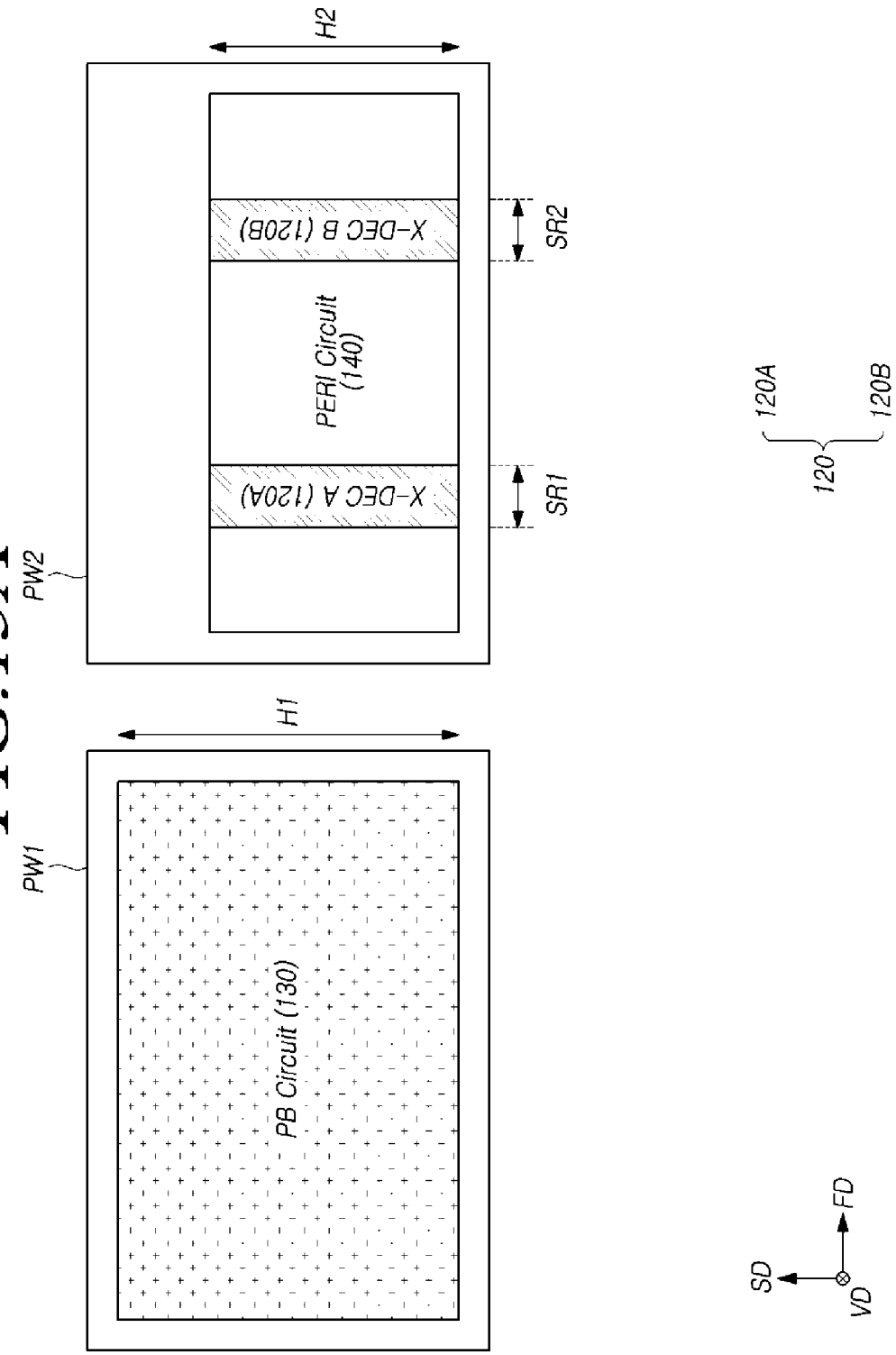
FIG. 15A is a diagram illustrating a representation of a layout of a memory device related to the disclosure.
Figure 15B:
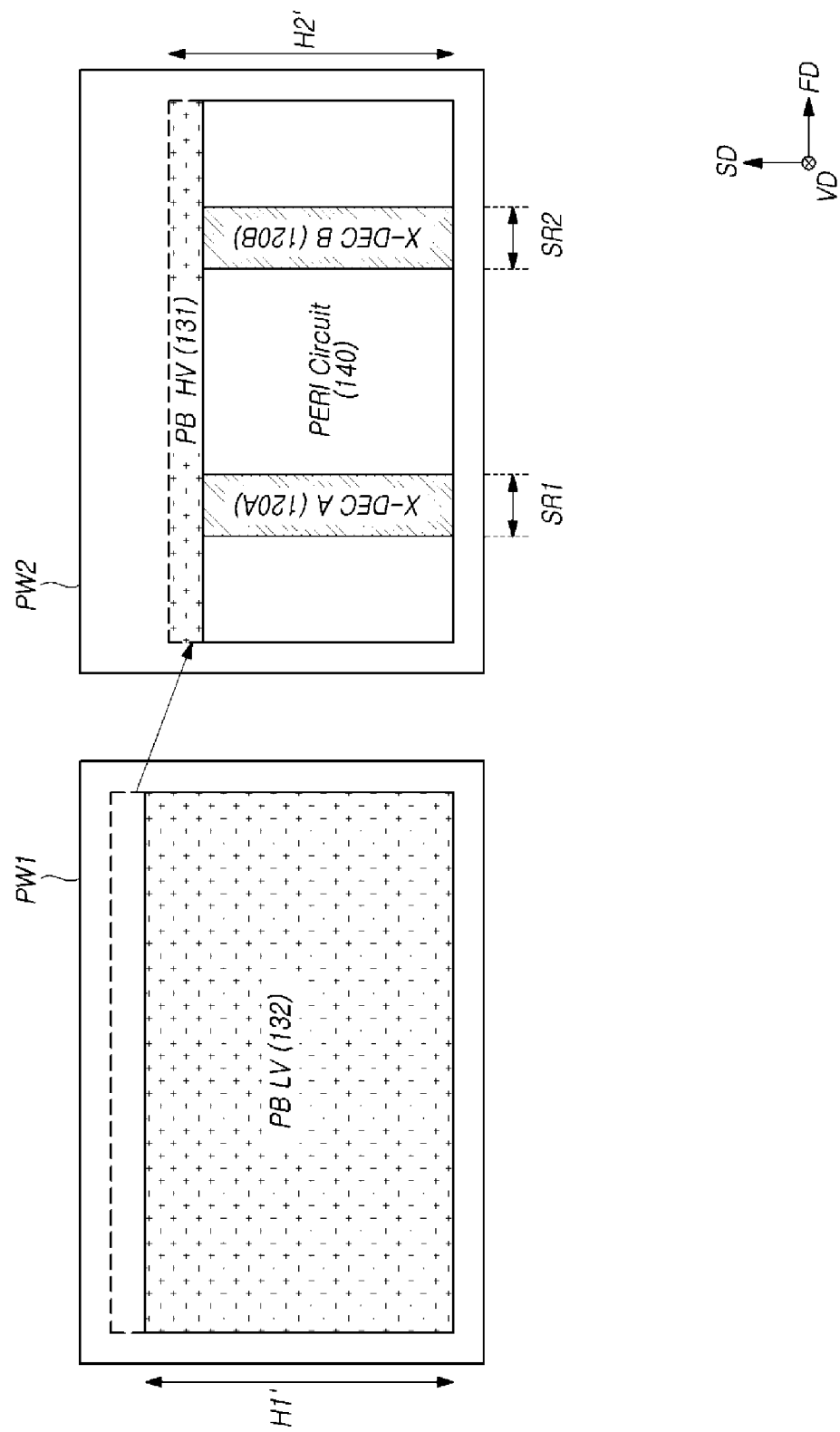
FIG. 15B is a diagram illustrating a representation of a layout of a memory device in accordance with an embodiment of the disclosure.

FIG. 15A is a diagram illustrating a representation of a layout of a memory device related to the disclosure, and FIG. 15B is a diagram illustrating a representation of a layout of a memory device in accordance with an embodiment of the disclosure.

FIG. 15A illustrates a case where a page buffer circuit (PB Circuit) 130 is disposed in a first peripheral wafer PW1 and a row decoder circuit 120 and a peripheral circuit PERI Circuit 140 are disposed in a second peripheral wafer PW2. The reference symbols 120A (X-DEC A) and 120B (X-DEC B) denote two portions, respectively, of the row decoder circuit 120, which are divided in correspondence to two slimming regions SR1 and SR2.

The dimension of the page buffer circuit 130 in the second direction SD is H1 and the dimension of each of the peripheral circuit 140 and the row decoder circuit 120 in the second direction SD is H2, and H2 is smaller than H1. Thus, the size of the memory device in the second direction SD is determined based on the dimension H1, and as a result, the memory device may have a large size.

Referring to FIG. 15B, if the position of a page buffer high-voltage circuit (PB HV) 131 of a page buffer circuit is changed to a second peripheral wafer PW2, and if only a page buffer low-voltage circuit (PB LV) 132 is disposed in a first peripheral wafer PW1, then a difference may be reduced between a dimension H1' in the second direction SD of a circuit included in the first peripheral wafer PW1, and a dimension H2' in the second direction SD of a circuit included in the second peripheral wafer PW2. Namely, the dimensions H1' and H2' are smaller than the dimension H1 of FIG. 15A. Accordingly, the overall dimension of the memory device in the second direction SD is determined based on the dimension H1' or H2' having a size smaller than the dimension H1, so the size of the memory device may be reduced.

Figure 16:
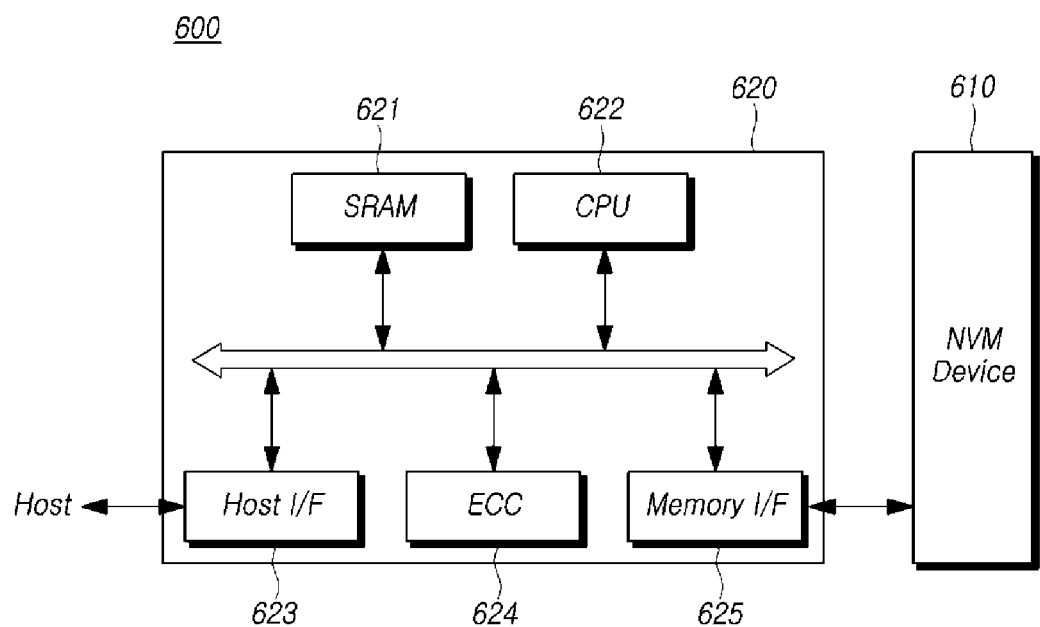
FIG. 16 is a block diagram schematically illustrating a representation of an example of a memory system including a memory device in accordance with an embodiment of the disclosure.

FIG. 16 is a block diagram schematically illustrating a representation of an example of a memory system including a memory device in accordance with an embodiment of the disclosure.

Referring to FIG. 16, a memory system 600 in accordance with an embodiment may include a nonvolatile memory device (NVM Device) 610 and a memory controller 620.

The nonvolatile memory device (NVM Device) 610 may be constituted by a memory device described above and may operate in the manner described above. The memory controller 620 may be configured to control the nonvolatile memory device (NVM Device) 610. By the combination of the nonvolatile memory device (NVM Device) 610 and the memory controller 620, a memory card or a solid state disk (SSD) may be provided. An SRAM 621 is used as a working memory of a processing unit (CPU) 622. A host interface (Host I/F) 623 includes a data exchange protocol of a host, which is coupled with the memory system 600.

An error correction code block (ECC) 624 detects and corrects an error included in data read from the nonvolatile memory device (NVM Device) 610.

A memory interface (Memory I/F) 625 interfaces with the nonvolatile memory device (NVM Device) 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 17:
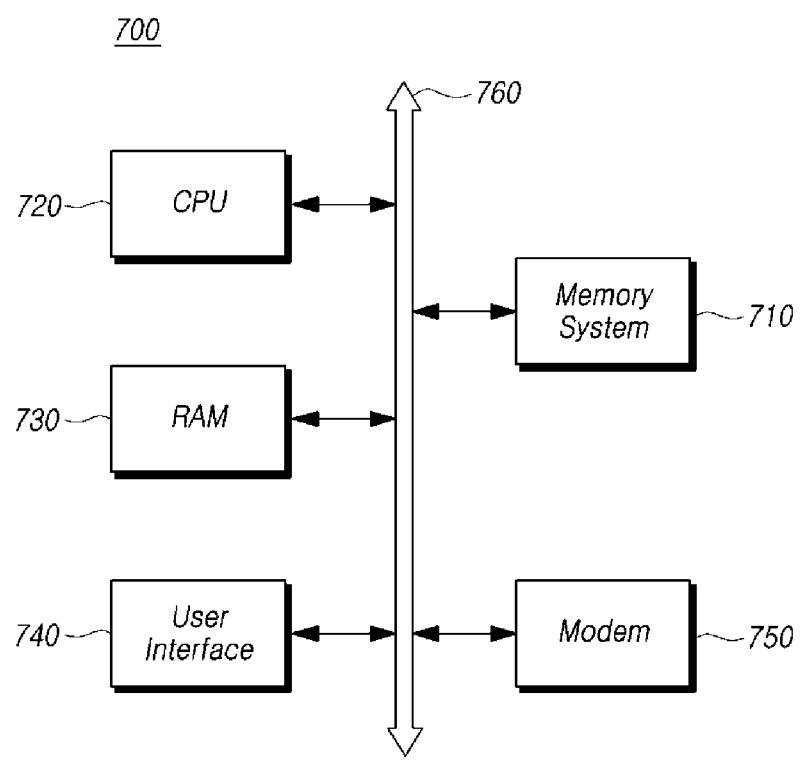
FIG. 17 is a block diagram schematically illustrating a representation of a computing system including a memory device in accordance with an embodiment of the disclosure.

FIG. 17 is a block diagram schematically illustrating a representation of a computing system including a memory device in accordance with an embodiment of the disclosure.

Referring to FIG. 17, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory device having a vertical structure, comprising:
    a memory cell array, defined in a cell wafer, and having a plurality of word lines extending in a first direction and arranged in a second direction, and having a plurality of bit lines extending in the second direction and arranged in the first direction; and
    a logic circuit, configured to control the memory cell array, that includes a page buffer low-voltage circuit, a page buffer high-voltage circuit, a row decoder circuit and a peripheral circuit,
    wherein the page buffer low-voltage circuit is disposed in a first peripheral wafer and the page buffer high-voltage circuit, the row decoder circuit and the peripheral circuit are disposed in a second peripheral wafer, and
    wherein the cell wafer overlaps with the first peripheral wafer and the second peripheral wafer in a vertical direction that is perpendicular to a plane formed by the first direction and the second direction.

2. The memory device according to claim 1,
    wherein the memory device includes a plurality of slimming regions that extend in the second direction and are arranged in the first direction,
    wherein the page buffer low-voltage circuit includes a plurality of page buffer low-voltage groups that includes page buffer low-voltage groups that number 2N times a number of the slimming regions, wherein N is a natural number, and
    wherein an N number of page buffer low-voltage groups is disposed on each side, in the first direction, of each of the plurality of slimming regions.

3. The memory device according to claim 2,
    wherein the page buffer high-voltage circuit includes a plurality of page buffer high-voltage groups that includes page buffer high-voltage groups that number the same as the page buffer low-voltage groups in the plurality of page buffer low-voltage groups, and each of the plurality of page buffer high-voltage groups is disposed to overlap in the vertical direction with a corresponding one of the plurality of page buffer low-voltage groups, and
    wherein a dimension of each of the plurality of page buffer high-voltage groups in the second direction is smaller than a dimension of each of the plurality of page buffer low-voltage groups in the second direction.

4. The memory device according to claim 3, wherein a center of each of the plurality of page buffer high-voltage groups is aligned with a centerline, extending in the first direction, of a corresponding one of the plurality of page buffer low-voltage groups.

5. The memory device according to claim 2,
wherein the page buffer high-voltage circuit includes a plurality of page buffer high-voltage groups that includes page buffer high-voltage groups that number two times the number of the page buffer low-voltage groups in the plurality of page buffer low-voltage groups, and
wherein a pair of page buffer high-voltage groups that corresponds to one of the plurality of page buffer low-voltage groups overlaps the one of the plurality of page buffer low-voltage groups in the vertical direction, and the pair of page buffer high-voltage groups are spaced apart from each other in the second direction.

6. The memory device according to claim 2,
wherein the row decoder circuit includes a pass transistor circuit,
wherein the pass transistor circuit includes a plurality of pass transistor groups that includes pass transistor groups that number 2N times the number of the slimming regions, and each of the plurality of pass transistor groups is disposed along a corresponding one of the plurality of slimming regions, and
wherein a dimension of each of the plurality of pass transistor groups in the second direction is smaller than a dimension of each plurality of page buffer low-voltage groups in the second direction.

7. The memory device according to claim 6, wherein a 2N number of pass transistor groups are spaced apart in the first direction and in the second direction to zigzag along a corresponding one slimming region.

8. The memory device according to claim 7, wherein at least a portion of each of the 2N number of pass transistor groups is disposed in the corresponding slimming region.

9. The memory device according to claim 6,
wherein the plurality of slimming regions includes a first slimming region and a second slimming region that are adjacent to each other in the first direction with a cell region interposed therebetween, and
wherein a first 2N number of pass transistor groups corresponding to the first slimming region and a second 2N number of pass transistor groups corresponding to the second slimming region are disposed to be separated from each other in the first direction with the first slimming region, the second slimming region and the cell region interposed therebetween.

10. The memory device according to claim 6,
wherein a center of each of the 2N number of pass transistor groups is aligned with a centerline, extending the second direction, of a corresponding one of the plurality of slimming regions.

11. A memory device having a vertical structure, comprising:
is a cell wafer including a memory cell array;
a first peripheral wafer including a first logic circuit which includes a plurality of first transistors and controls the memory cell array; and
a second peripheral wafer including a second logic circuit which includes a plurality of second transistors and controls the memory cell array,
wherein the number of kinds of thicknesses of gate dielectric layers of the first transistors is smaller than the number of kinds of thicknesses of gate dielectric layers of the second transistors.

12. The memory device according to claim 11,
wherein the first peripheral wafer includes a first wiring line, and the second peripheral wafer includes a second wiring line, and
wherein the first wiring line is formed of a material that has a resistivity lower than that of the second wiring line.

13. The memory device according to claim 11, wherein the first logic circuit includes a page buffer low-voltage circuit, and the second logic circuit includes a page buffer high-voltage circuit, a row decoder circuit and a peripheral circuit.

14. The memory device according to claim 3,
wherein the row decoder circuit includes a pass transistor circuit,
wherein the pass transistor circuit includes a plurality of pass transistor groups that includes pass transistor groups that number 2N times the number of the slimming regions,
wherein a pass transistor group is disposed to overlap, in the vertical direction, with one of the plurality of page buffer low-voltage groups,
wherein the pass transistor group is disposed to abut an edge of a corresponding one of the plurality of slimming regions, and an edge of the pass transistor group is disposed to overlap, in the vertical direction, an edge of the one of the plurality of page buffer low-voltage groups, and
wherein an edge of the one of the plurality of page buffer high-voltage groups is disposed to overlap, in the vertical direction, with an edge of the corresponding page buffer low-voltage group that is opposite to the edge of the corresponding page buffer low-voltage group that overlaps with the edge of the pass transistor group.

15. The memory device according to claim 14,
wherein an edge of the pass transistor group and an edge of the one of the plurality of page buffer high-voltage groups abut the same edge of the corresponding slimming region.

16. The memory device according to claim 14,
wherein an edge of the pass transistor group and an edge of the one of the plurality of page buffer high-voltage groups abut opposite edges of the corresponding slimming region.

17. The memory device according to claim 4,
wherein the row decoder circuit includes a pass transistor circuit,
wherein the pass transistor circuit includes a plurality of pass transistor groups that includes pass transistor groups that number 2N times the number of the slimming regions,
wherein a pass transistor group is disposed to overlap, in the vertical direction, with one of the plurality of page buffer low-voltage groups that corresponds to one of the plurality of high-voltage groups,
wherein an edge of the pass transistor group is disposed to abut an edge of a corresponding one of the plurality of slimming regions that is common to an edge of the one of the page buffer low-voltage groups, and another edge of the pass transistor group is disposed to overlap, in the vertical direction, another adjacent edge of the one of the page buffer low-voltage groups.

18. The memory device according to claim 4, wherein a center of each of the plurality of pass transistor groups is aligned with a centerline, extending in the second direction, of a corresponding one of the plurality of slimming regions.

19. The memory device according to claim 9,
wherein the page buffer high-voltage circuit includes a plurality of page buffer high-voltage groups that includes page buffer high-voltage groups that number two times the number of the page buffer low-voltage groups in the plurality of page buffer low-voltage groups,
wherein the first 2N number of pass transistor groups are disposed, in a top view, to alternate with a first 2N number of page buffer high-voltage groups in the second direction, and
wherein, in a top view, the second 2N number of pass transistor groups are disposed to alternate with a second 2N number of page buffer high-voltage groups in the second direction.

20. The memory device according to claim 10,
wherein the page buffer high-voltage circuit includes a plurality of page buffer high-voltage groups that includes page buffer high-voltage groups that number two times the number of the page buffer low-voltage groups in the plurality of page buffer low-voltage groups,
wherein pass transistor groups are disposed, in a top view, to alternate with page buffer high-voltage groups along an edge of each of the plurality of slimming region in the second direction.

\* \* \* \* \*